[12] United States Patent  
Takahashi et al.

(10) Patent No.: US 7,939,830 B2  
(45) Date of Patent: May 10, 2011

(54) DISPLAY DEVICE

(75) Inventors: Hiroki Takahashi, Yokohama (JP); Shigeru Ohno, Yokohama (JP); Kunihiko Watanabe, Chiba (JP); Junichi Uehara, Mobara (JP); Tsuyoshi Uchida, Mobara (JP); Yasuko Gotoh, Mobara (JP)

(73) Assignee: Hitachi Displays, Ltd., Chiba (JP)

( * ) Notice: Subject to any disclaimer, the term of this patent is extended or adjusted under 35 U.S.C. 154(b) by 154 days.

(21) Appl. No.: 12/477,981

(22) Filed: Jun. 4, 2009

(65) Prior Publication Data

US 2009/0302320 A1 Dec. 10, 2009

(30) Foreign Application Priority Data

Jun. 6, 2008 (JP) ................. 2008-148815

(51) Int. Cl.
*H01L 23/52* (2006.01)
*H01L 23/535* (2006.01)
(52) U.S. Cl. .... 257/72; 257/208; 257/773; 257/E23.001
(58) Field of Classification Search .................. 257/72, 257/208, 773, E23.001
See application file for complete search history.

(56) References Cited

FOREIGN PATENT DOCUMENTS

| JP | 2007-273828 | 10/2007 |
|----|-------------|---------|
| JP | 2008-300755 | 12/2008 |

*Primary Examiner* — Evan Pert
(74) *Attorney, Agent, or Firm* — Antonelli, Terry, Stout & Kraus, LLP.

(57) ABSTRACT

An object of the present invention is to provide a display device where a semiconductor layer pattern formed between a pair of electrodes can be formed to a predetermined size, even in the case where the distance between the electrodes on top of a semiconductor layer pattern is relatively large in elements formed in accordance with a photoresist reflow technology. The present invention provides a display device where elements are formed on an insulating substrate, characterized in that the above described elements comprise: a semiconductor layer pattern formed on a main surface of the above described insulating substrate or an insulating film layer formed on the main surface; and a number of electrodes provided in parallel at a distance from each other on the above described semiconductor layer pattern, the above described number of electrodes are a first electrode, a second electrode and dummy electrodes located between the first electrode and the second electrode, and the above described number of electrodes are patterned so that a protrusion is formed, in which the above described electrodes are aligned at on least one end side of at least one of the facing sides.

10 Claims, 20 Drawing Sheets

ND DEVICE

The present application claims priority over Japanese Application JP2008-148815 filed on Jun. 6, 2008, the contents of which are hereby incorporated into this application by reference.

BACKGROUND OF THE INVENTION (1) Field of the Invention

The present invention relates to a display device, and in particular, to a display device having an electronic circuit on the display substrate.

(2) Related Art Statement

Thin film transistors and resistor elements used as electronic circuit elements in display devices are manufactured by repeating a film formation step of forming various metal films, insulating films and semiconductor films on a glass substrate in plate form, a photolithography step of forming a photoresist pattern in order to give these films a predetermined form, an etching step of removing part of the films and leaving them in the region covered by the photoresist pattern, and a photoresist pattern removing step of removing the photoresist pattern.

However, it has become necessary to increase the size and performance of manufacturing units, because liquid crystal televisions are becoming more and more common, the size and resolution of screens are becoming larger, and power consumption has been becoming lower, and as a result, increase in power consumption and increase in the amount of materials used in the manufacture process have become a problem. Thus, less power consumption and amount of materials used has been required for manufacture, by shortening the manufacturing process for thin film transistors and resistor elements.

In order to shorten the manufacturing process for thin film transistors and resistor elements, it is most effective to reduce the number of photolithography steps. This is because reduction in the number of photolithography steps makes it possible to reduce the number of etching steps and the number of steps for removing the photoresist pattern at the same time.

A photoresist reflow technology, for example, has been proposed as a technology for reducing the number of photolithography steps (see Patent Document 1 below). In this technology, a new photoresist pattern is formed by softening the photoresist, so that the photoresist pattern changes when an organic solvent permeates into the photoresist pattern, which is formed in advance.

The photoresist reflow technology is expected to be used as a technology for forming a semiconductor layer pattern and a source/drain electrode pattern in reverse-stagger type thin film transistors, for example, in a single photolithography step.

As shown in FIG. 2A, in the photoresist reflow technology, first a gate insulating film 8, an intrinsic semiconductor thin film 9, an impurity semiconductor thin film 10 and a thin film 11 for source/drain electrodes are formed in sequence in upper layers of the insulating substrate 6 on which a gate electrode pattern 7 is formed in advance, and after that, photoresist patterns 12a and 12b are formed on the thin film 11.

Next, as shown in FIG. 2B, the thin film 11 and the thin film 10 in regions exposed from the photoresist patterns 12a and 12b are etched in sequence, so that a source electrode pattern 11a, a drain electrode pattern 11b, and ohmic contact layers 10a and 10b are formed.

Next, as shown in FIG. 2C, a new photoresist pattern 12c is formed by reflowing photoresist patterns 12a and 12b. In this case, the photoresist pattern 12c deforms during the reflow process, so that the photoresist pattern 12a on the source electrode pattern 11a and the photoresist pattern 12b on the drain electrode pattern 11b are connected.

Next, as shown in FIG. 2D, the thin film 9 in a region which is exposed from the photoresist pattern 12c is etched, so that a semiconductor layer pattern 9c is formed.

Then, as shown in FIG. 2E, the photoresist pattern 12c is removed and the process is completed.

[Patent Document 1] Japanese Unexamined Patent Publication 2007-273828

SUMMARY OF THE INVENTION

Problem to Be Solved by the Invention

In the technique described in the above Patent Document 1, a surfactant is selectively absorbed in regions that are to be covered by the photoresist pattern 12c, so that the flow of the photoresist accelerates, in order to form the semiconductor layer 10c under control. However, adding a step for absorbing a surfactant makes it unclear whether or not the manufacturing process is shorter as a whole.

In addition, the above described technique does not seem to be practical, because back channel regions in the semiconductor layer pattern 10c become contaminated with the surfactant, and thus, there is a risk that properties of the transistors and diodes may be negatively affected.

Furthermore, the above described technique makes it possible to form small channel regions with a channel length in the micrometers through a reflow process in a short period time. However, it is expected that thicker films will be required for the photoresist pattern formed in the photolithography step, and more time for the reflow process, in order to form large channel regions with a channel length in the tens of micrometers to hundreds of micrometers, and thus, the technique does not seem to be practical for reducing the amount of photoresist material used and shortening the manufacturing process as a whole.

An object of the present invention is to provide a display device where a semiconductor layer pattern of predetermined dimensions can be formed between pairs of electrodes in a semiconductor layer pattern, even in the case where the distance between the electrodes is relatively large in elements formed in accordance with a photoresist reflow technology.

Means for Solving Problem

Means for achieving the above described object are described below in reference to FIGS. 1A and 1B. FIG. 1A is a plan diagram and FIG. 1B a cross sectional diagram along line X-X' in FIG. 1A.

In FIGS. 1A and 1B, five dummy electrodes 4 are provided in an upper layer of the semiconductor layer 1 formed on top of the insulating substrate 5 so as to be aligned in parallel with the electrodes 2 and 3.

The two adjacent dummy electrodes 4 on the left in the figure have a pattern where the two ends protrude toward a first electrode from the center (to the left in the figure). The dummy electrode in the middle in the figure has a pattern where the two ends protrude toward the first and second electrodes from the center. The two adjacent dummy electrodes on the right in the figure have a pattern where the two ends protrude toward the second electrode from the center (to the right in the figure). The intervals between the adjacent dummy electrodes 4 are approximately constant in the longitudinal direction of the dummy electrodes 4. Likewise, the electrodes 2 and 3 have small protrusions, so that the distance from the adjacent dummy electrodes 4 is the same as the intervals between the dummy electrodes 4.

A least one side has a recess in the pattern as viewed in a plane, between the dummy electrodes 4 formed as described above and the facing second electrode.

The patterns for the electrodes 2 and 3 and the dummy electrodes 4 are formed at the same time during the manufacturing process, in accordance with publicly known technology for film formation, photolithography and etching. Accordingly, the electrodes 2 and 3 and the dummy electrodes 4 are all covered with a photoresist before the above described photoresist reflow process is carried out.

It is necessary for a portion of the photoresist which covers the above described electrode 2 and a portion of the photoresist which covers the above described electrode 3 to be connected after reflow, in order to form the new photoresist pattern required for the final pattern of the semiconductor layer 1 to function as a channel region through the above described photoresist reflow process.

The present invention is first characterized in that a portion of the photoresist which covers the above described dummy electrodes 4 is connected to a portion of the photoresist which covers the above described electrode 2, and another portion of the photoresist which covers the above described dummy electrodes 4 is connected to a portion of the photoresist which covers the above described electrode 3 during the reflow process, and as a result, a portion of the photoresist which covers the above described electrode 2 and a portion of the photoresist which covers the above described electrode 3 are connected as a continuous photoresist pattern via the photoresist which covers the above described dummy electrode 4.

The continuous photoresist pattern is used as a mask, and publicly known etching technology and photoresist pattern removing technology can be used, and thus, it becomes possible to form a pattern for the semiconductor layer 1 having long channel.

The present invention is secondly characterized in that at least one of the facing ends at the shortest distance in the pattern has a recess in the form as viewed in a plane when the above described electrodes 2 and 3 and the above described dummy electrodes 4 are patterned.

The photoresist liquefies during the reflow process, and therefore, the form of the photoresist pattern after reflow depends on the surface tension of the photoresist in a liquid state. Surface tension is the properties of a liquid that make it contract into a spherical shape, because this gives it a minimal surface area, and originates from the intermolecular force within the liquid.

Accordingly, the photoresist is drawn into the bent portion (recess) in the case where the photoresist pattern has a bent portion in the form as viewed in a plane before reflow. At this time, how much of the photoresist is drawn into the recess depends on the curvature ratio of the bent portion as a whole. That is to say, the higher the curvature is (the sharper the curve), the more of the photoresist is drawn into the recess.

In addition, in the case where a number of pieces of the photoresist which are separate in the pattern before reflow are connected in the reflow process, these have such properties as to have the same movement as a single piece of photoresist in a liquid state, that is to say, they contract into a spherical shape.

In order to accelerate the photoresist which covers the above described electrode 2, the photoresist which covers the above described electrode 3 and the photoresist which covers the above described dummy electrodes 4 to be connected in a continuous photoresist pattern through a reflow process, it is desirable for at least one of the facing ends at the shortest distance in the photoresist pattern to have a recess in the form as viewed in a plane before reflow, taking the principle of the above described properties of the liquid into consideration.

The present invention can provide the following structures, for example.

(1) The display device according to the present invention is, for example, a display device where elements are formed on an insulating substrate, and characterized in that the above described elements comprise:
a semiconductor layer pattern formed on a main surface of the above described insulating substrate or an insulating film layer formed on the main surface; and
a number of electrodes provided in parallel at a distance from each other on the above described semiconductor layer pattern,
the above described number of electrodes are a first electrode, a second electrode and dummy electrodes located between the first electrode and the second electrode, and
the above described number of electrodes are patterned so that a protrusion is formed, in which the above described electrodes are aligned at on least one end side of at least one of the facing sides.

(2) The display device according to the present invention is that in (1), characterized in that a dummy electrode has a pattern where the two ends protrude from the center in one direction in which electrodes are aligned.

(3) The display device according to the present invention is that in (1), characterized in that a dummy electrode has a pattern where one end protrudes from the center in one direction in which electrodes are aligned and the other end protrudes in the other direction in which electrodes are aligned.

(4) The display device according to the present invention is that in (1), characterized in that a dummy electrode has a pattern where the center protrudes in one direction in which electrodes are aligned and the two ends protrude in the other direction in which electrodes are aligned.

(5) The display device according to the present invention is that in (1), characterized in that a dummy electrode has a pattern where one end protrudes from the center in one direction in which electrodes are aligned and the other end protrudes in the other direction in which electrodes are aligned.

(6) The display device according to the present invention is that in (1), characterized in that the above described elements are thin film transistors where the above described first electrode is either the source electrode or the drain electrode and the second electrode is the other, and a gate electrode is provided beneath the above described insulating film.

(7) The display device according to the present invention is that in (1), characterized in that
a display region is formed of a number of pixels on the above described insulating substrate and
the above described elements are formed outside the above described display region as resistor elements.

(8) The display device according to the present invention is that in (1), characterized in that the above described insulating film is made of silicon nitride, silicon oxide or silicon nitride oxide, and the above described semiconductor layer pattern is made of amorphous silicon or crystalline silicon.

(9) The display device according to the present invention is that in (1), characterized in that
each of the above described electrodes is formed of an impurity semiconductor layer and a metal layer layered on top of the semiconductor layer, and
the above described impurity semiconductor layer is formed as an ohmic contact layer.

(10) The display device according to the present invention is that in (1), characterized in that the above described electrodes are formed so as to have one of the following structures:

a one-layer structure of chromium, a chromium alloy, tungsten, a tungsten alloy, titanium, a titanium alloy, molybdenum, a molybdenum, an aluminum alloy or a copper alloy;

a two-layer structure of an aluminum alloy and chromium or a chromium alloy;

a two-layer structure of an aluminum alloy and tungsten or a tungsten alloy;

a two-layer structure of an aluminum alloy and titanium or a titanium alloy;

a two-layer structure of an aluminum alloy and molybdenum or a molybdenum alloy;

a two-layer structure of a copper alloy and chromium or a chromium alloy;

a two-layer structure of a copper alloy and tungsten or a tungsten alloy;

a two-layer structure of a copper alloy and titanium or a titanium alloy;

a two-layer structure of a copper alloy and molybdenum or a molybdenum alloy;

a three-layer structure an aluminum alloy between two layers of chromium or a chromium alloy;

a three-layer structure of an aluminum alloy between two layers of tungsten or a tungsten alloy;

a three-layer structure of an aluminum alloy between two layers of molybdenum or a molybdenum alloy;

a three-layer structure of a copper alloy between two layers of chromium or a chromium alloy;

a three-layer structure of a copper alloy between two layers of tungsten or a tungsten alloy;

a three-layer structure of a copper alloy between two layers of titanium or a titanium alloy;

a three-layer structure of a copper alloy between two layers of molybdenum or a molybdenum alloy.

Here, the above described structures are merely examples, and appropriate modifications are possible within such a scope as not to deviate from the technical idea of the present invention. In addition, examples of structures of the present invention other than those described above will become more clear from the descriptions of the present specification as a whole, as well as the drawings.

EFFECTS OF THE INVENTION

According to the present invention, the size of the channel can be controlled with high precision without increasing the number of steps for surface treatment before reflow, contaminating the back channel region, increasing the film thickness of the photoresist patterns or making the time for the reflow process longer, even in the case where the channels in the semiconductor layer are long when reverse stagger type thin film transistors or photoresistor elements are formed using a photoresist reflow technology. Accordingly, the manufacturing process for display devices is shorter and the power required for manufacture and the amount of material used can be reduced when the present invention is used.

Other effects of the present invention will become more clear from the description of the specification as a whole.

EXPLANATION OF SYMBOLS

Figure 1A:
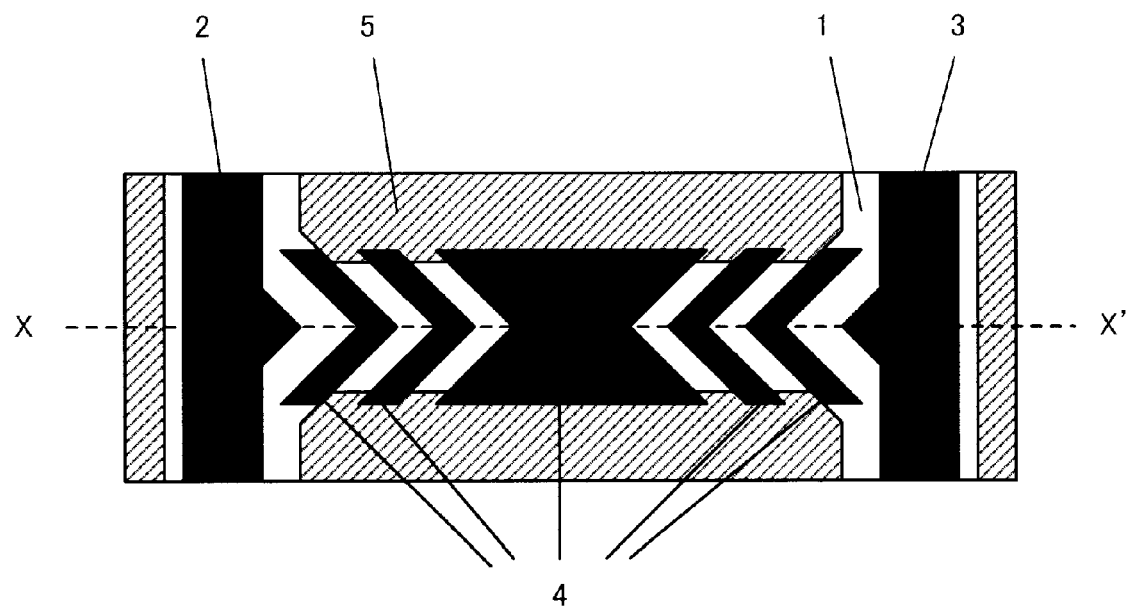
FIGS. 1A and 1B are diagrams illustrating a means for solving the problem according to the present invention.
Figure 1B:
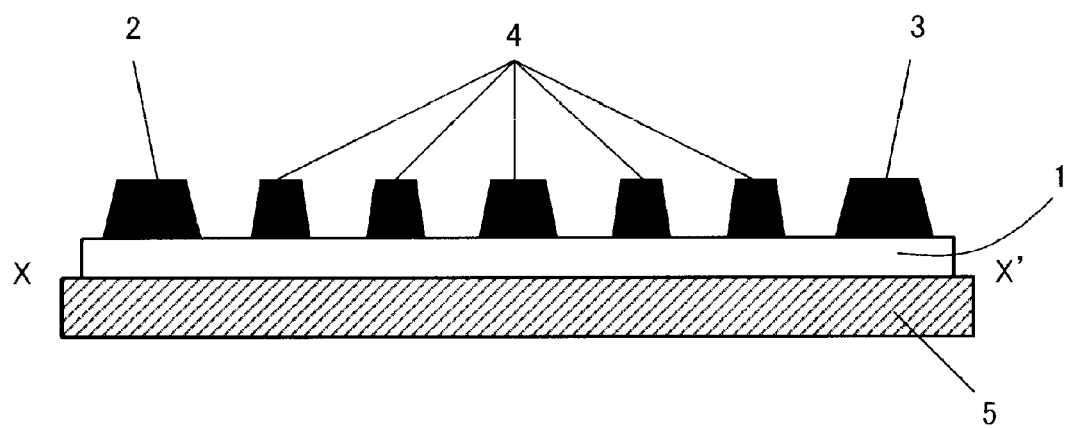
Figure 2A:
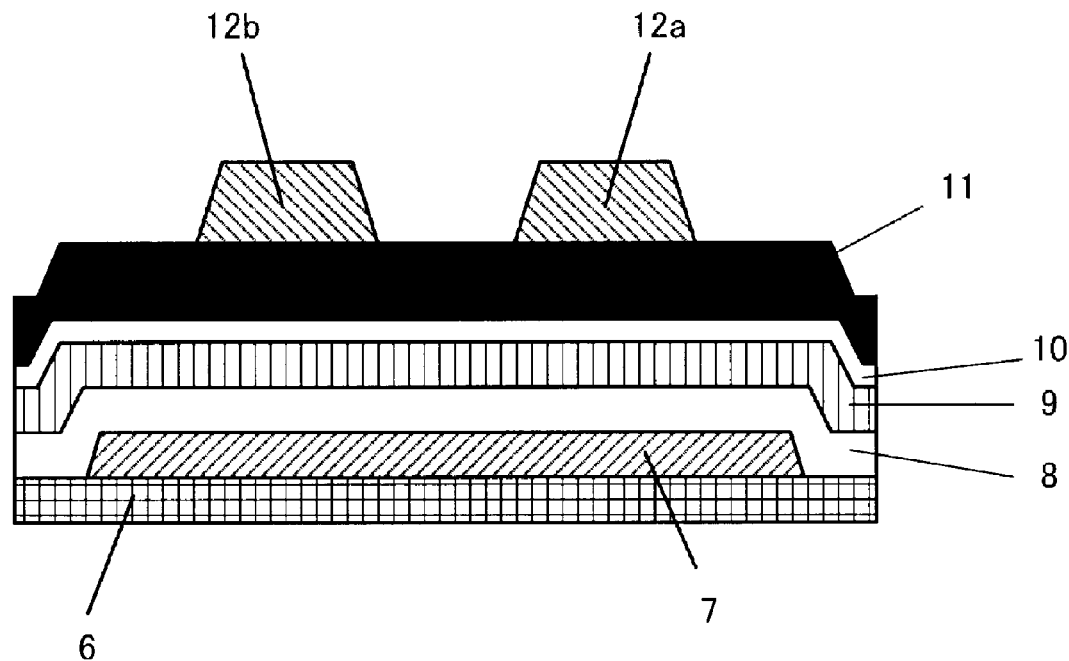
FIGS. 2A to 2E are diagrams showing the steps in a conventional method for pattern formation using a photoresist reflow technology.
Figure 2B:
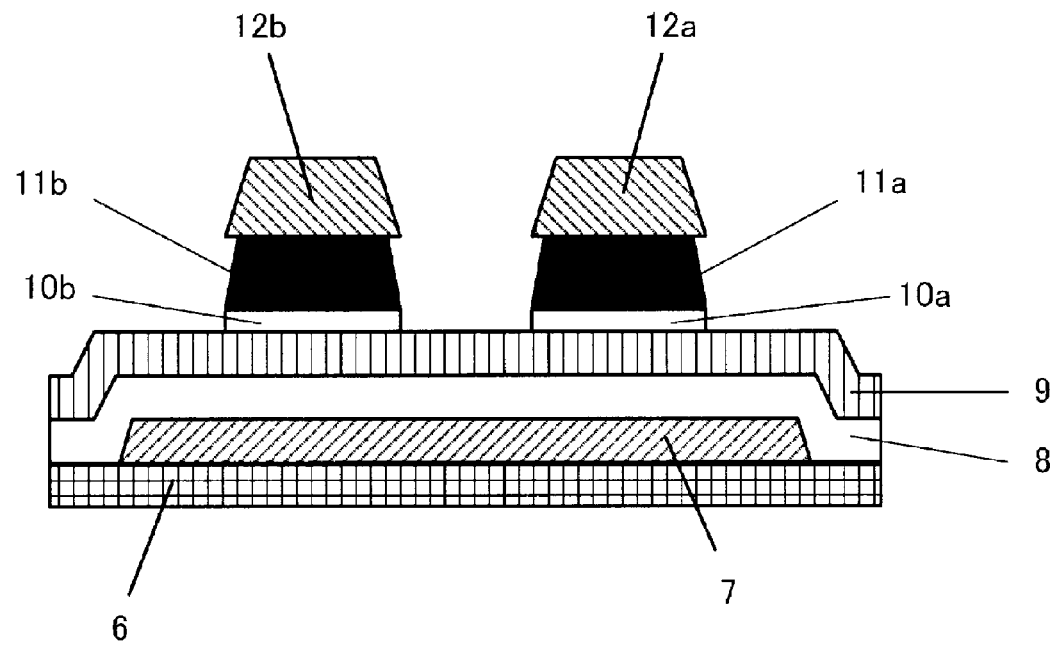
Figure 2C:
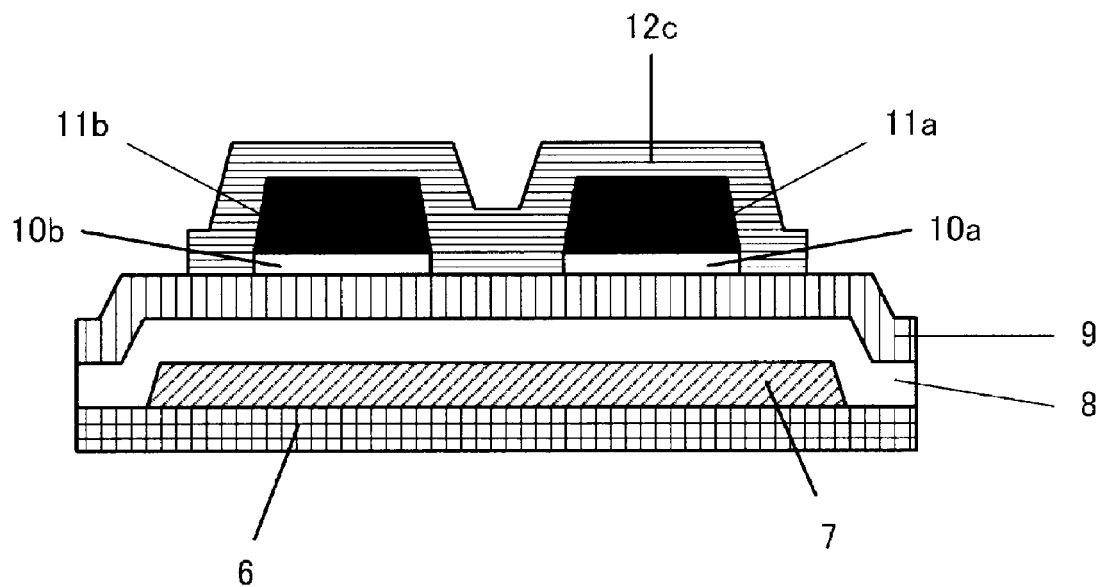
Figure 2D:
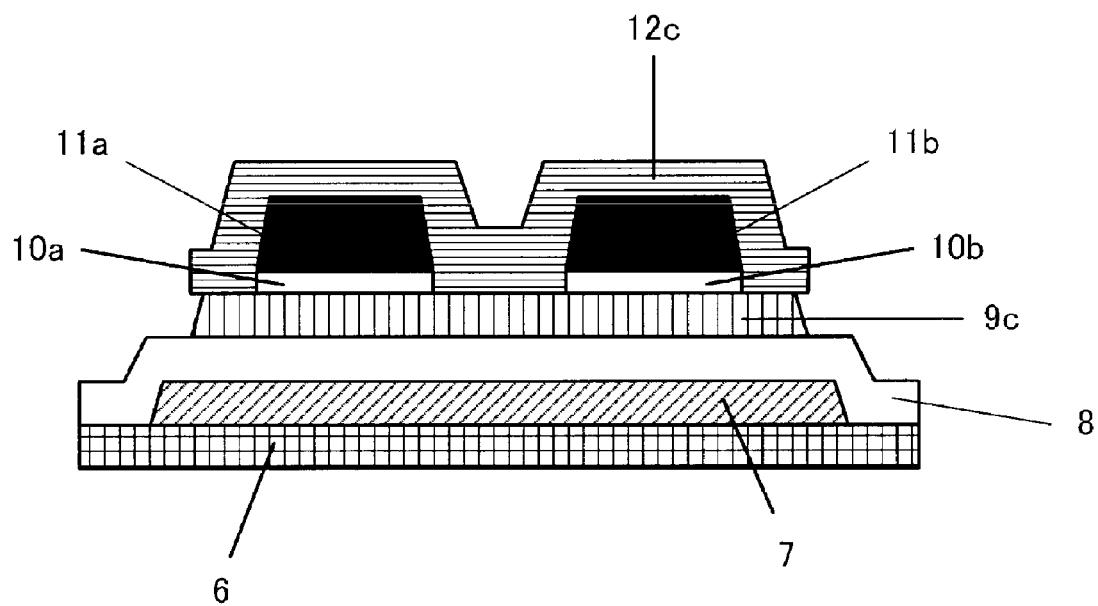
Figure 2E:
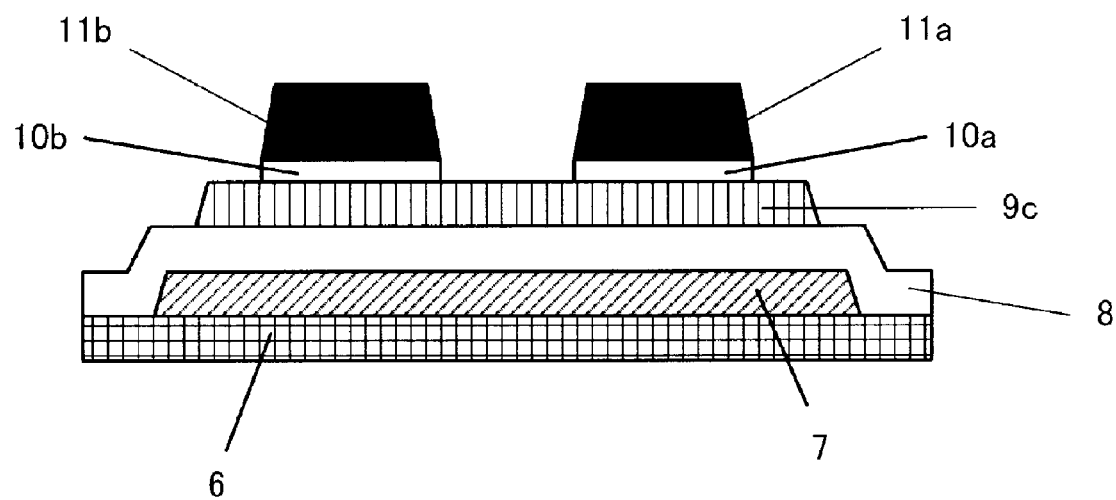

1 . . . semiconductor layer; 2, 3 . . . electrodes; 4 . . . dummy electrode; 5 . . . insulating substrate; 6 . . . insulating substrate; 7 . . . gate electrode pattern; 8 . . . gate insulating film; 9 . . . intrinsic semiconductor thin film; 9c . . . semiconductor layer pattern; 10 . . . impurity semiconductor thin film; 10a, 10b . . . ohmic contact layers; 11 . . . thin film for source/drain wires; 11a . . . source electrode pattern; 11b . . . drain electrode pattern; 12a . . . photoresist pattern for forming source electrodes; 12b . . . photoresist pattern for forming drain electrodes; 12c . . . photoresist pattern formed through reflow process; 13 . . . glass substrate; 14 . . . gate electrode; 15 . . . insulating film; 16 . . . silicon film; 16d . . . semiconductor layer pattern; 17 . . . doped silicon film; 17a, 17b, 17c . . . ohmic contact layers; 18 . . . metal film; 18a . . . source electrode; 18b . . . drain electrode; 18c . . . dummy electrode; 19a . . . photoresist pattern for forming source electrodes; 19b . . . photoresist pattern for drain electrodes; 19c . . . photoresist pattern for forming dummy electrode; 19d . . . photoresist pattern formed through reflow process; 20 . . . passivation film; 20a, 20b, 20e . . . contact holes; 21b . . . drain wire; 21e . . . gate wire; 22 . . . transparent conductive film; 22a . . . source terminal; 22b . . . drain terminal; 22e . . . gate terminal; 23a . . . photoresist pattern for forming pixel electrodes or source terminals; 23b . . . photoresist pattern for forming drain terminals; 23e . . . photoresist pattern for forming gate terminals; 24a . . . pixel electrode; 25 . . . glass substrate; 26 . . . insulating film; 27 . . . silicon film; 27d . . . semiconductor layer pattern; 28 . . . doped silicon film; 28a, 28b, 28c . . . ohmic contact layers; 29 . . . metal film; 29a, 29b . . . electrodes; 29c . . . dummy electrode; 30a, 30b . . . photoresist patterns for forming electrodes; 30c . . . photoresist pattern for forming dummy electrode; 30d . . . photoresist pattern formed through reflow process; 31 . . . passivation film; 32a, 32b . . . electrodes; 32c . . . dummy electrode; 33 . . . semiconductor layer pattern.

DETAILED DESCRIPTION OF THE INVENTION

In the following, the display device according to the embodiments of the present invention is described in reference to the drawings.

First Embodiment

FIGS. 3A to 3H are schematic diagrams showing part of the manufacturing process for a reverse stagger type thin film transistor formed in a liquid crystal display panel. Thin film transistors are not only used as active elements in pixels in the display region, but also as peripheral circuit elements in the non-display region. FIGS. 3A to 3H show a thin film transistor for use in a pixel as an active element, together with the peripheral structure. Here, in FIGS. 3A to 3H, the diagrams on the left are plan diagrams and the diagrams on the right are cross sectional diagrams along line X-X' in the plan diagrams.

In the following, the descriptions follow the order of the steps.

Figure 3A:
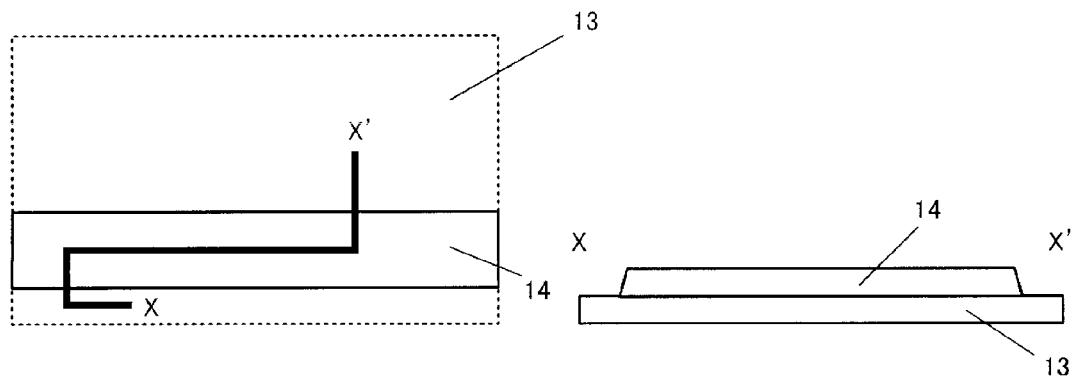
FIGS. 3A to 4E are diagrams showing the steps in the manufacturing method for a display device according to one embodiment of the present invention.

Step 1 (FIG. 3A)

First, gate signal lines 14 are formed on a glass substrate 13 from a metal in accordance with a publicly known film formation technology, photolithography technology, etching technology and photoresist pattern removing technology. Part of these gate signal lines 14 functions as a gate electrode for a thin film transistor.

The metal for the gate signal lines 14 is, for example: a one-layer structure of chromium, a chromium alloy, tungsten, a tungsten alloy, titanium, a titanium alloy, molybdenum, a molybdenum, an aluminum alloy or a copper alloy; a two-layer structure of an aluminum alloy and chromium or a chromium alloy; a two-layer structure of an aluminum alloy and tungsten or a tungsten alloy; a two-layer structure of an aluminum alloy and titanium or a titanium alloy; a two-layer structure of an aluminum alloy and molybdenum or a molybdenum alloy; a two-layer structure of a copper alloy and chromium or a chromium alloy; a two-layer structure of a copper alloy and tungsten or a tungsten alloy; a two-layer structure of a copper alloy and titanium or a titanium alloy; a two-layer structure of a copper alloy and molybdenum or a molybdenum alloy; a three-layer structure an aluminum alloy between two layers of chromium or a chromium alloy; a three-layer structure of an aluminum alloy between two layers of tungsten or a tungsten alloy; a three-layer structure of an aluminum alloy between two layers of molybdenum or a molybdenum alloy; a three-layer structure of a copper alloy between two layers of chromium or a chromium alloy; a three-layer structure of a copper alloy between two layers of tungsten or a tungsten alloy; a three-layer structure of a copper alloy between two layers of titanium or a titanium alloy; or a three-layer structure of a copper alloy between two layers of molybdenum or a molybdenum alloy.

Figure 3B:
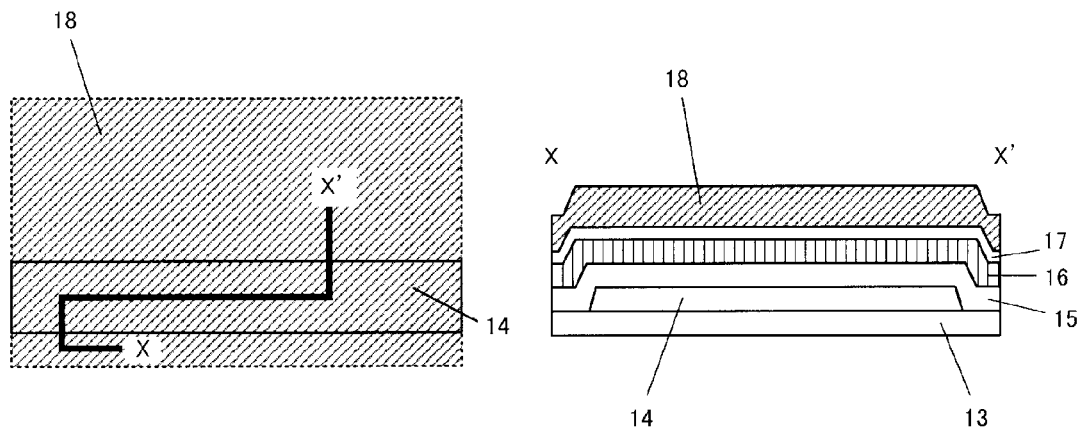

Step 2 (FIG. 3B)

Next, an insulating film 15, a silicon film 16, a doped silicon film 17, and a metal film 18 are formed on top of the glass substrate 13 and the gate signal lines 14 in sequence. The insulating film 15 may be formed of silicon nitride, silicon oxide or silicon nitride oxide, for example. The main component of the silicon film 16 and the doped silicon film 17 may be, for example, amorphous silicon or crystalline silicon. Like the gate signal lines 14, the metal film 18 is made of: a one-layer structure of chromium, a chromium alloy, tungsten, a tungsten alloy, titanium, a titanium alloy, molybdenum, a molybdenum, an aluminum alloy or a copper alloy; a two-layer structure of an aluminum alloy and chromium or a chromium alloy; a two-layer structure of an aluminum alloy and tungsten or a tungsten alloy; a two-layer structure of an aluminum alloy and titanium or a titanium alloy; a two-layer structure of an aluminum alloy and molybdenum or a molybdenum alloy; a two-layer structure of a copper alloy and chromium or a chromium alloy; a two-layer structure of a copper alloy and tungsten or a tungsten alloy; a two-layer structure of a copper alloy and titanium or a titanium alloy; a two-layer structure of a copper alloy and molybdenum or a molybdenum alloy; a three-layer structure an aluminum alloy between two layers of chromium or a chromium alloy; a three-layer structure of an aluminum alloy between two layers of tungsten or a tungsten alloy; a three-layer structure of an aluminum alloy between two layers of molybdenum or a molybdenum alloy; a three-layer structure of a copper alloy between two layers of chromium or a chromium alloy; a three-layer structure of a copper alloy between two layers of tungsten or a tungsten alloy; a three-layer structure of a copper alloy between two layers of titanium or a titanium alloy; or a three-layer structure of a copper alloy between two layers of molybdenum or a molybdenum alloy, for example.

Figure 3C:
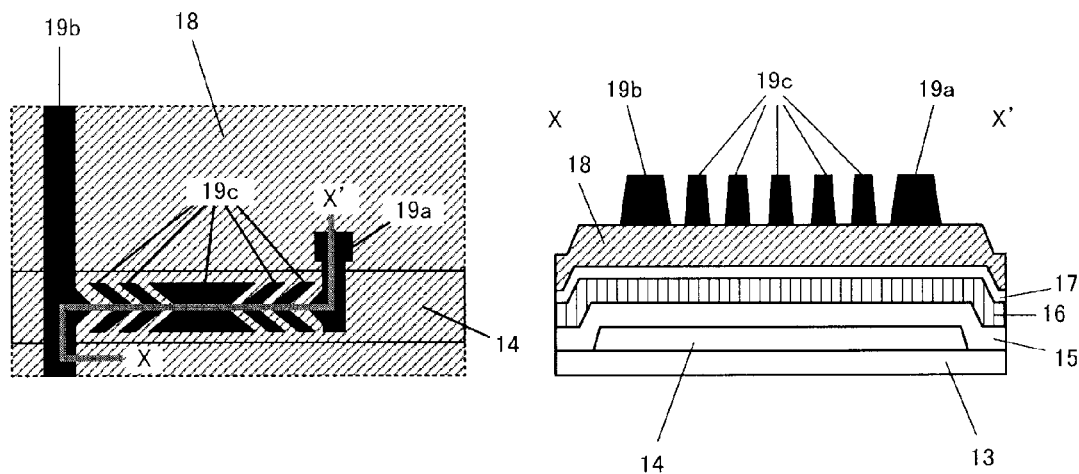

Step 2 (FIG. 3C)

Next, a photoresist pattern 19a, 19b and 19c is formed as upper layers of the metal film 18 in accordance with a publicly known photolithography technology. At this time, a number of pieces of the photoresist pattern 19c are provided so as to be aligned in parallel between the pieces of photoresist pattern 19a and 19b. The photoresist pattern 19a corresponds to the source electrodes in a plane, the photoresist pattern 19b corresponds to drain electrodes in a plane, and the photoresist pattern 19c corresponds to dummy electrodes in a plane. As is clear from the left in FIG. 3C, the form of the pieces of photoresist pattern 19c is polygons in V shape with an angle of 90° inside the bent portion (recess) in a plane. However, they may have a curved portion (for example in U shape) in a plane instead of being polygons. It is important to provide a recess, as described above, in the direction in which the flow of the photoresist is to be accelerated during the below described reflow process. In addition, the angle of the recess may be an acute angle or an obtuse angle. It is effective for the angle of the recess to be an acute angle, as is clear from the principle relating to the properties of the above described liquid, in order to increase the ratio (L/W) of the channel length (L) to the channel width (W) in the semiconductor layer.

Figure 3D:
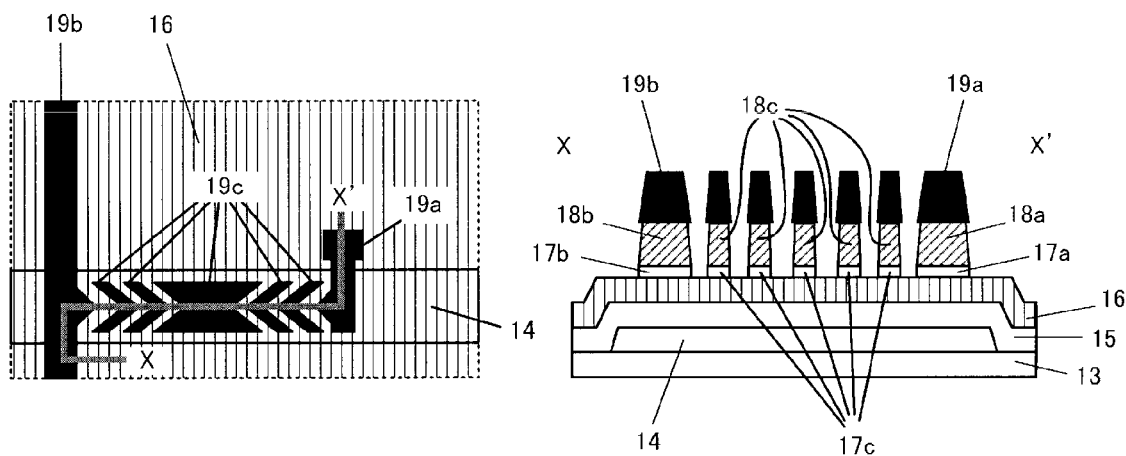

Step 3 (FIG. 3D)

Next, the metal film 18 is removed in accordance with a publicly known wet etching technology or dry etching technology in the region exposed from the photoresist pattern 19a, 19b and 19c, and furthermore, the doped silicon film 17 is removed in accordance with a publicly known dry etching technology. As a result, an ohmic contact layer 17a, 17b and 17c made of doped silicon, source electrodes 18a, drain electrodes 18b and a dummy electrode 18c made of a metal film are formed on top of the silicon film 16.

Figure 3E:
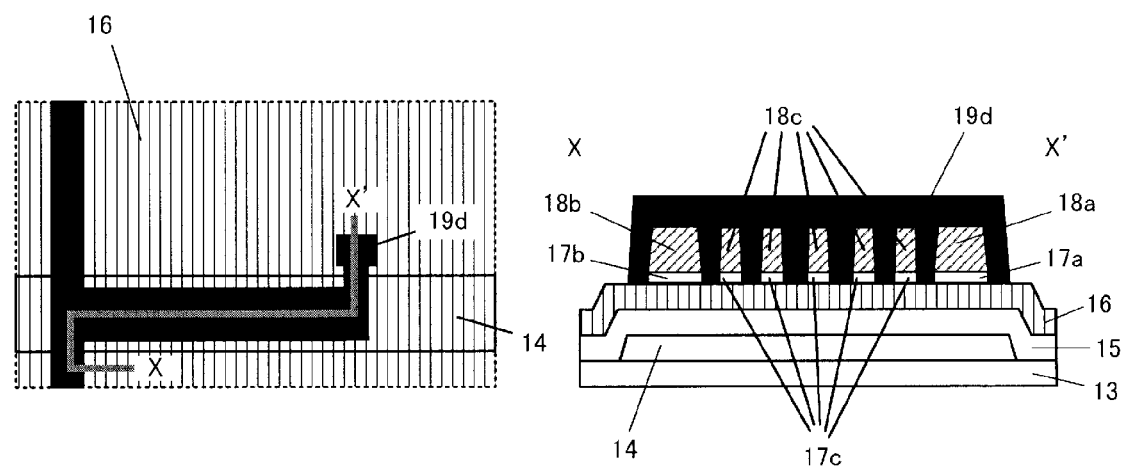

Step 4 (FIG. 3E)

Next, the photoresist pattern 19a, 19b and 19c are deformed through flowing, so that a new photoresist pattern 19d is formed. In this case, when the photoresist flows, it has the same properties as on the photoresist side in the above described dummy electrode 18c. Therefore, the new deformed photoresist pattern 19d is not disconnected, and becomes a continuous pattern. Accordingly, the photoresist pattern 19d is formed when the pieces of photoresist pattern 19a, 19b and 19c are connected in a plane, and the source electrodes 18a, the drain electrodes 18b and the dummy electrode 18c are covered with the continuous photoresist pattern 19d.

Figure 3F:
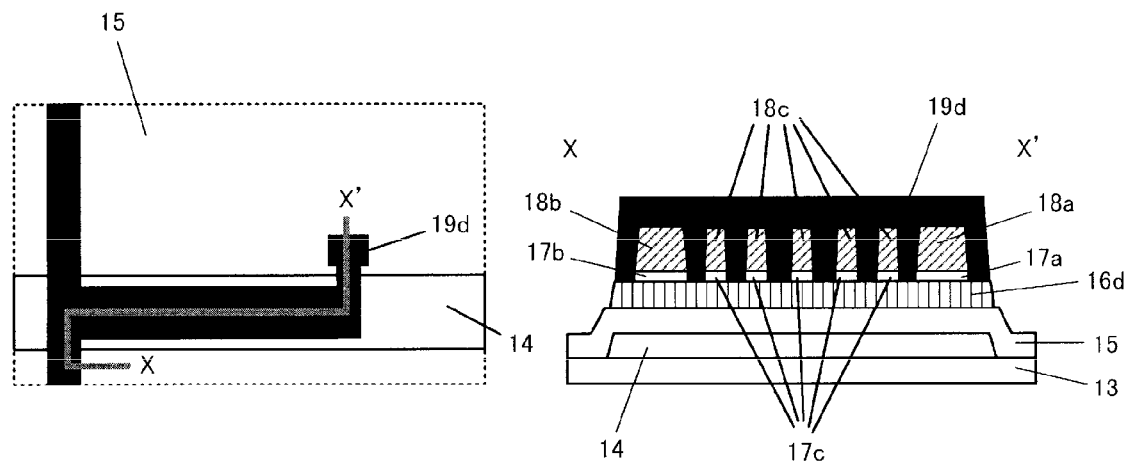
Figure 3G:
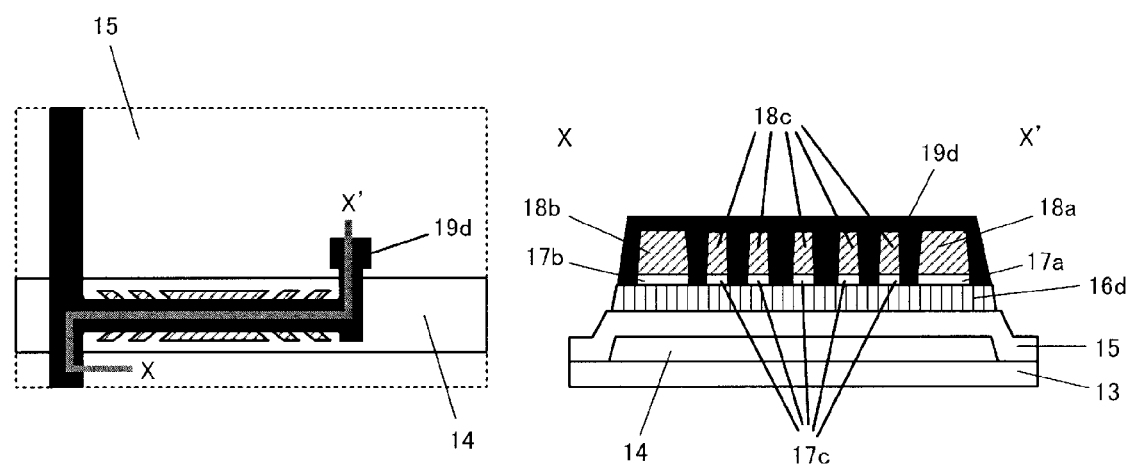

Step 5 (FIG. 3F)

Next, the silicon film 16 is removed in accordance with a publicly known dry etching technology in the region exposed from the photoresist pattern 19d. As a result, a semiconductor layer pattern 16d for providing channel regions for the transistors is formed. In this case, the pattern may be formed by removing the silicon film 16 through etching after removing a portion of the photoresist pattern 19d through etching. In addition, the step of removing a portion of the photoresist pattern 19d and the step of removing the silicon film 16 may be carried out at the same time. The ratio of the photoresist pattern 19d to the silicon film 16 in the thickness by which the film is etched can be controlled by adjusting the composition of the gas for etching and the RF power of the dry etching unit. Whatever the technique, it is possible to provide a final semiconductor layer pattern with a small channel width by increasing the thickness by which the film in the photoresist pattern 19d is etched and removing the silicon film 16 through etching (see FIG. 3G).

Figure 3H:
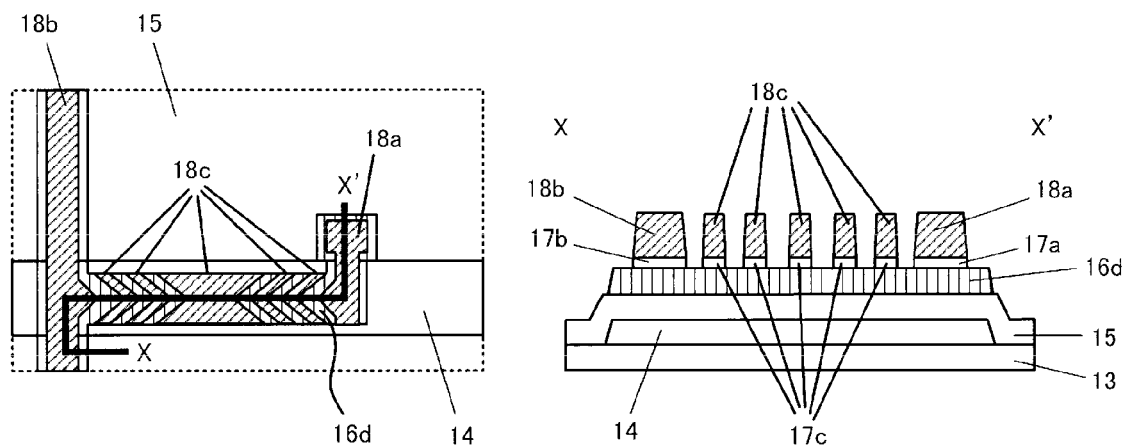

Step 6 (FIG. 3H)

Next, the photoresist pattern 19d is completely removed in accordance with a publicly known photoresist pattern removing technology. As a result, the semiconductor layer pattern 16d, the ohmic contact layer 17a, 17b and 17c, the source electrodes 18a, the drain electrodes 18b and the dummy electrode 18c are formed in one photolithography step for reverse stagger type thin film transistors.

Next, FIGS. 4A to 4E show steps in the manufacture up to the completion of the reverse stagger type thin film transistor for a liquid crystal display device.

Figure 4A:
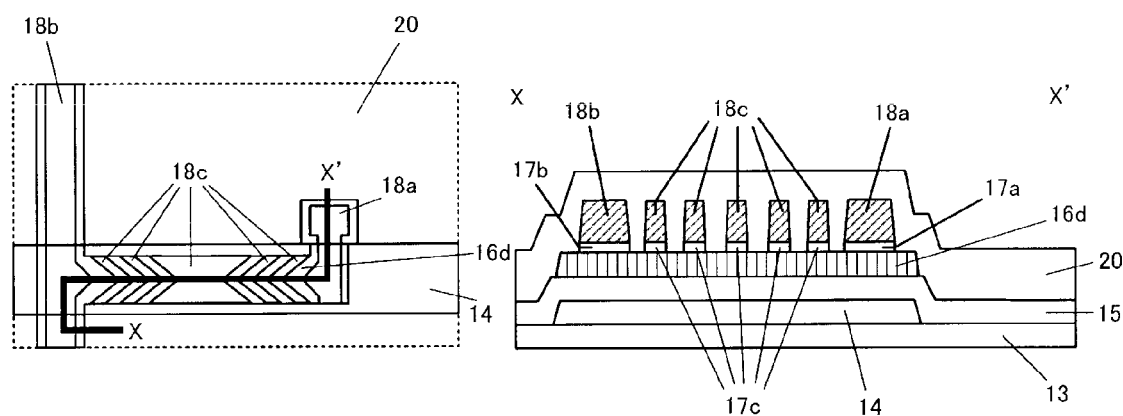

Step 7 (FIG. 4A)

A passivation film 20 is formed in accordance with a publicly known film formation technology, so that the insulating film 15, the semiconductor layer pattern 16d, the source electrodes 18a, the drain electrodes 18b and the dummy electrode 18c are covered. The passivation film 20 may be formed of silicon nitride, silicon oxide or silicon nitride oxide.

Figure 4B:
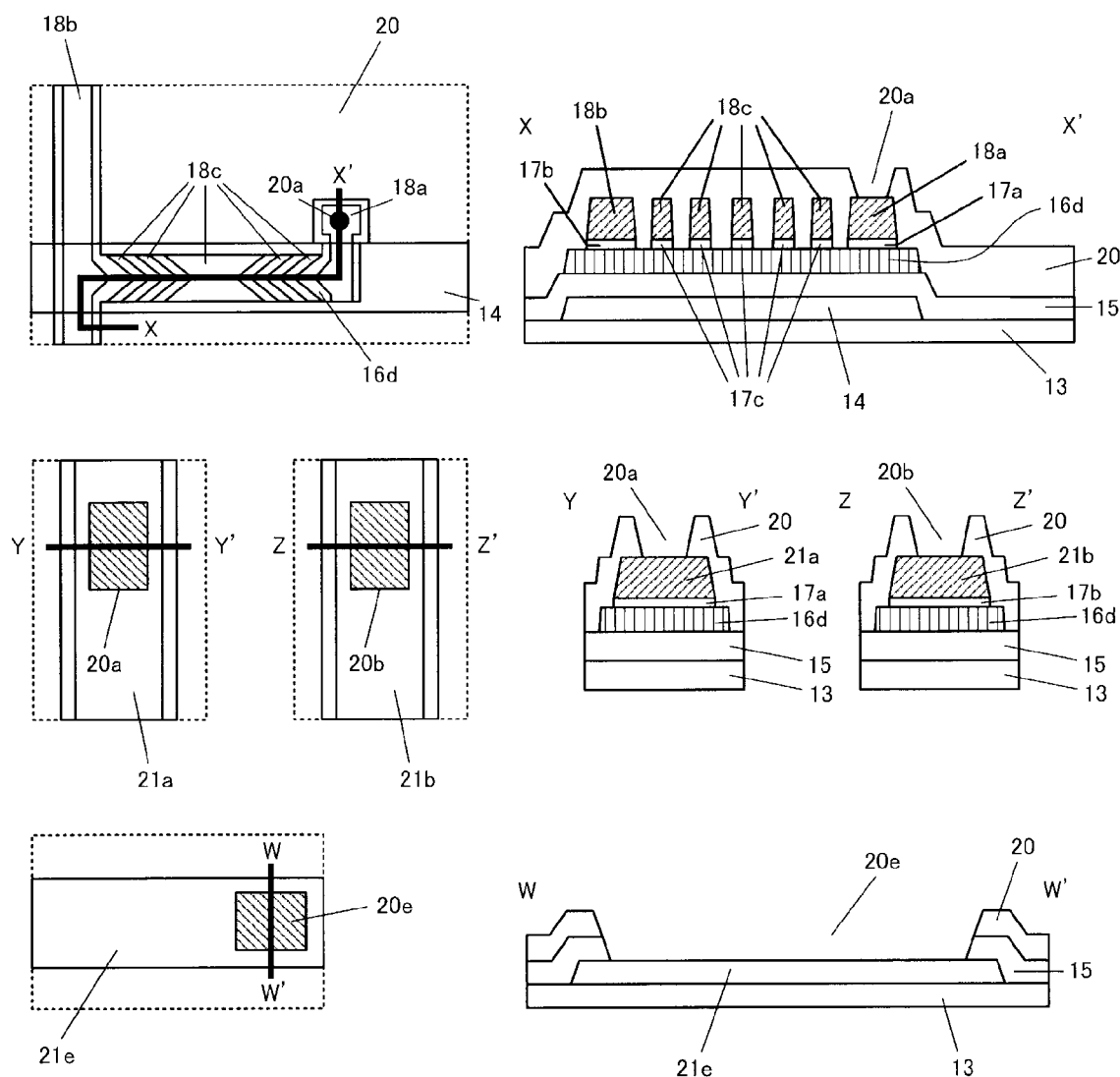

Step 8 (FIG. 4B)

Next, contact holes 20a are created, so that part of the source electrodes 18a is exposed, contact holes 20b are created, so that part of the end of the drain wires 21b extending from the drain electrodes 18b is exposed, and contact holes 20e are created, so that part of the end of the gate wires 21e extending from the gate electrodes 14 is exposed. Here, the dummy electrode 18c is independent of the other wires, and therefore, it is not necessary to provide any contact hole. The contact holes 20a, 20b and 20e may be created in accordance with a publicly known photolithography technology, dry etching technology or photoresist pattern removing technology.

Here, the left side in FIG. 4B is a plan diagram showing a contact hole 20a and the structure in its periphery, a contact hole 20b and the structure in its periphery, and a contact hole 20c and the structure in its periphery, and the right side is a cross sectional diagram showing a contact hole 20a and the structure in its periphery, a contact hole 20b and the structure in its periphery, and a contact hole 20c and the structure in its periphery. This is the same for FIGS. 4C, 4D and 4E.

Figure 4C:
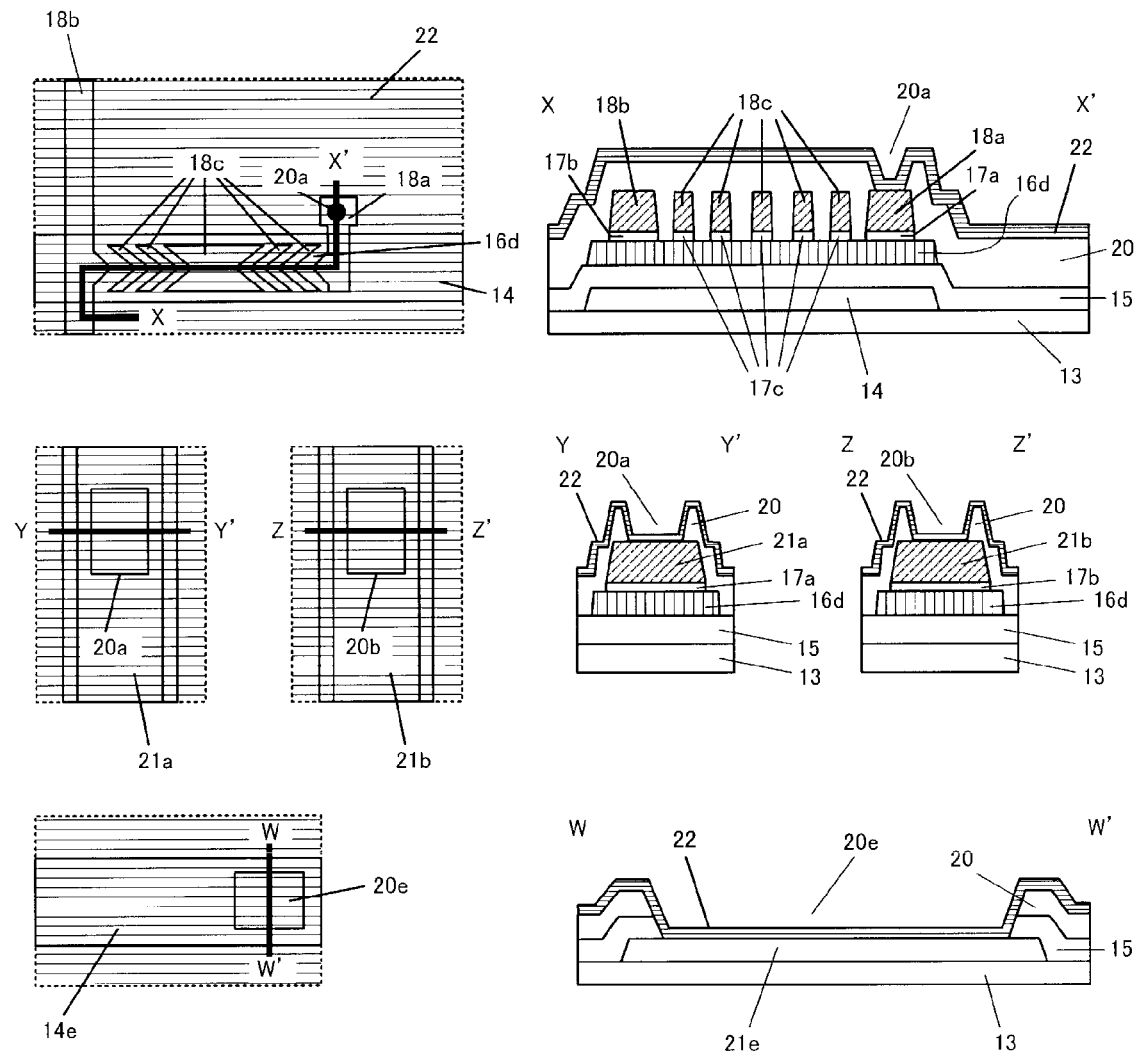

Step 9 (FIG. 4C)

Next, a transparent conductive film 22 is formed in accordance with a publicly known film formation technology, so that the exposed portion of the source electrodes 18a, the exposed portion of the drain wires 21d, the exposed portion of the gate wires 21e, the surface of the passivation film 20 and the side wall portions of the contact holes 20a, 20b and 20e are covered. The transparent conductive film 22 may be formed of indium-tin oxide, zinc oxide, or indium-tin-zinc oxide.

Figure 4D:
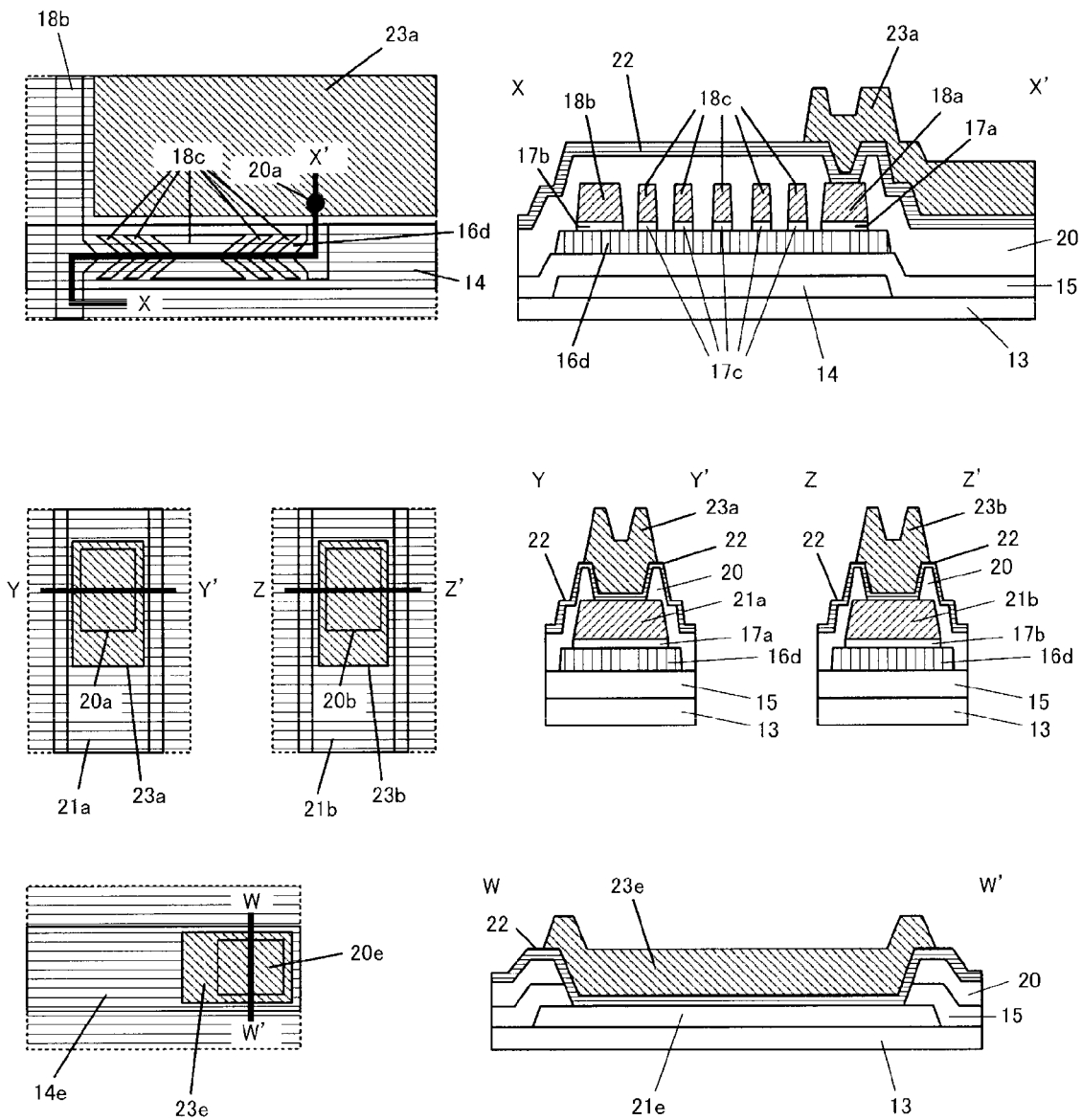

Step 10 (FIG. 4D)

Next, a photoresist pattern 23a, 23b and 23e is formed in an upper layer of the transparent conductive film 2 in accordance with a publicly known photolithography technology. At this time, portions in the photoresist pattern 23a in a plane are for forming pixel electrodes and source terminals, portions in the photoresist pattern 23b in a plane are for forming drain terminals, and portions in the photoresist pattern 23e in a plane are for forming gate terminals.

Figure 4E:
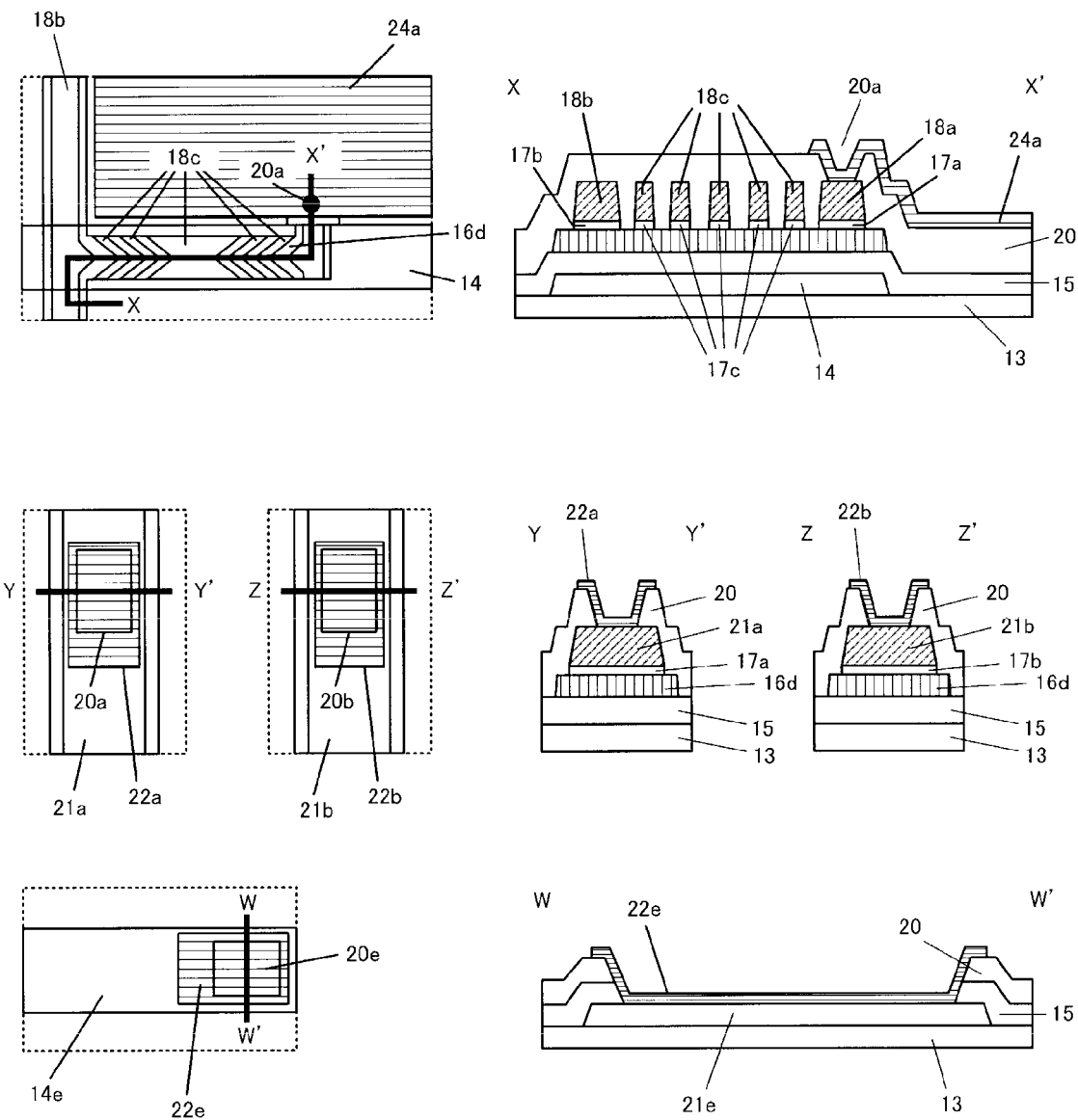

Step 11 (FIG. 4E)

Next, the transparent conductive film 22 is removed in accordance with a publicly known etching technology in regions which are not covered by any of the pieces of photoresist pattern 23a, 23b and 23e, and next the photoresist pattern 23a, 23b and 23e is removed in accordance with a publicly known photoresist pattern removing technology (FIG. 4E). As a result, pixel electrodes 24a and source terminals 22a which make contact with the source electrodes 18a, drain terminals 22b which make contact with the drain wires 21b and gate terminals 22e which make contact with the gate wires 21e are formed.

Reverse stagger type thin film transistors for a liquid crystal display device are manufactured through the above steps.

Second Embodiment

FIGS. 5A to 5G are schematic diagrams showing part of the manufacturing process for a resistor element. The resistor element is formed in the non-display region of the display device as an electrostatic protective circuit element, for example.

In the following, the steps are described in order.

Figure 5A:
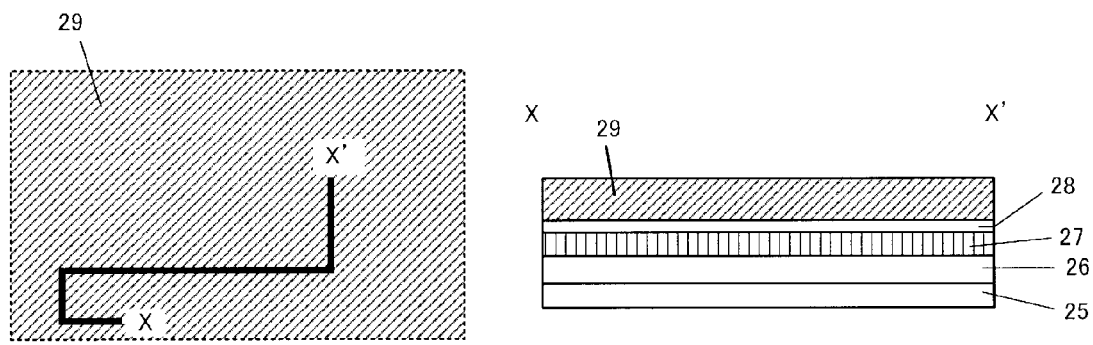
FIGS. 5A to 5G are diagrams showing the steps in the manufacturing method for a display device according to another embodiment of the present invention.

Step 1 (FIG. 5A)

First, an insulating film 26, a silicon film 27, a doped silicon film 28 and a metal film 29 are formed on top of a glass substrate 25 in sequence. The insulating film 26 is the same as the above described insulating film 15. The main component of the silicon film 27 and the doped silicon film 28 is the same as in the above described silicon film 16 and the doped silicon film 17, respectively. The metal film 29 is the same as the above described metal film 18.

Figure 5B:
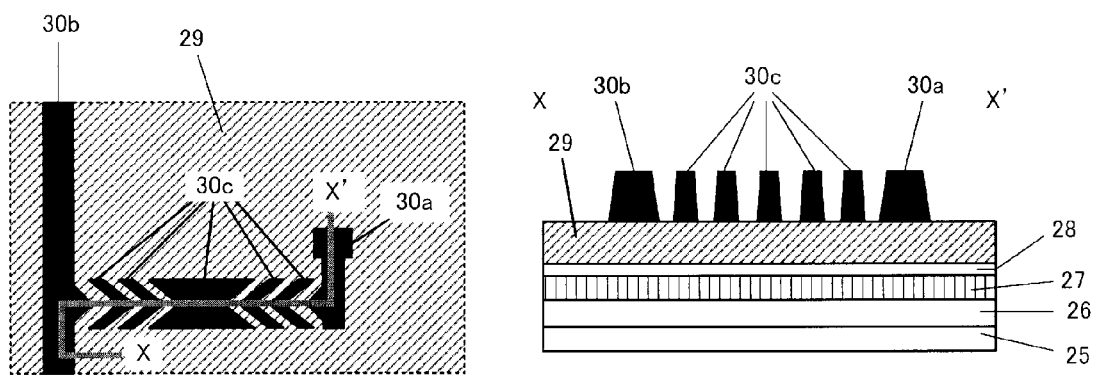

Step 2 (FIG. 5B)

Next, as in FIG. 3C, a photoresist pattern 30a, 30b and 30c is formed in an upper layer of the metal film 29. At this time, pieces of the photoresist pattern 30c are located between pieces of the photoresist pattern 30a and 30b. The photoresist pattern 30a and 30b is for forming electrodes, and the photoresist pattern 30c is for forming a dummy electrode in a plane. In addition, as with the above described photoresist pattern 19c, a recess may be provided in the photoresist pattern 30c in a plane, in the direction in which the flow of the photoresist is to be accelerated during the reflow process.

Figure 5C:
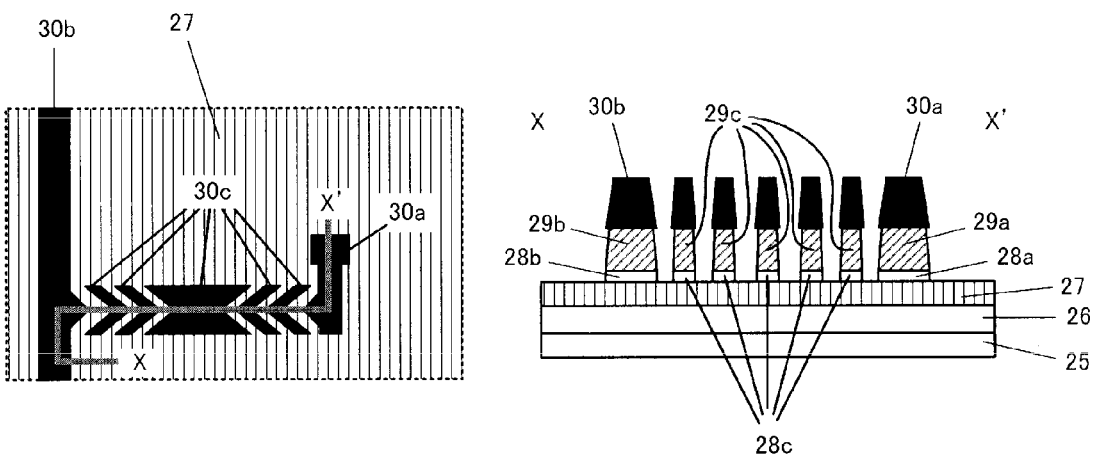

Step 3 (FIG. 5C)

Next, the metal film 29 is removed in accordance with a publicly known et etching technology or dry etching technology in regions exposed from the photoresist pattern 30a, 30b and 30c, and the doped silicon film 28, which is thus exposed, is removed in accordance with a publicly known dry etching technology (FIG. 5C). As a result, an ohmic contact layer 28a, 28b and 28c made of doped silicon, and an electrode 29a, an electrode 29b and a dummy electrode 29c made of a metal film are formed on top of the silicon film 27.

Figure 5D:
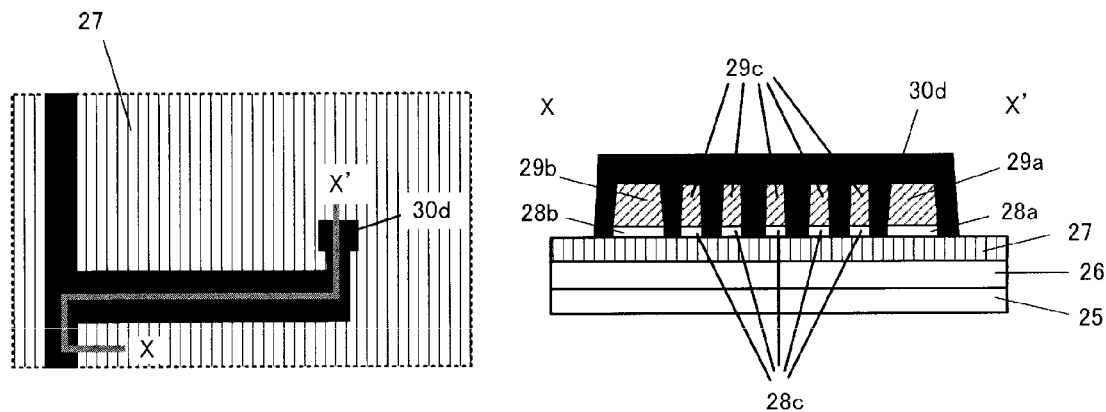

Step 4 (FIG. 5D)

Next, the photoresist pattern 30a, 30b and 30c is deformed so as to form a new photoresist pattern 30d in accordance with a publicly known photoresist reflow technology. In this case, the photoresist pattern 30d is formed when pieces of the photoresist pattern 30a, 30b and 30c are connected in a plane, and the electrode 29a, the electrode 29b and the dummy electrode 29c are covered with the continuous photoresist pattern 30d.

Figure 5E:
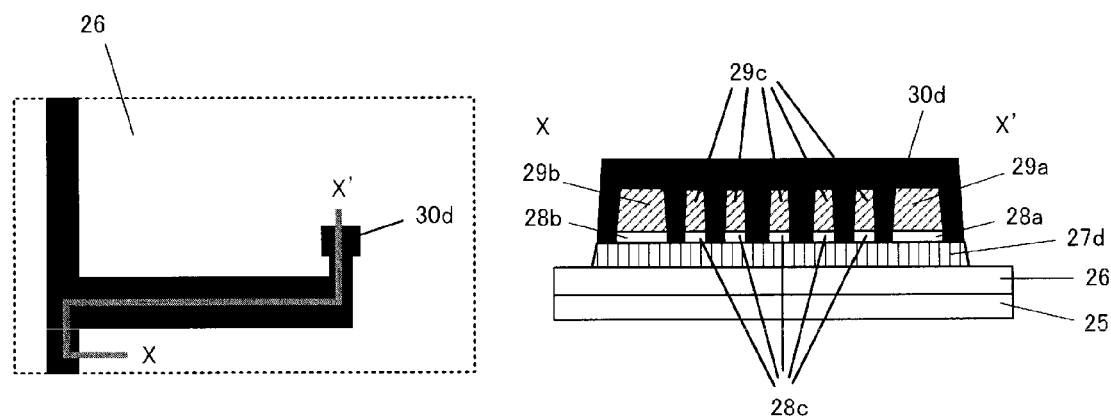
Figure 5F:
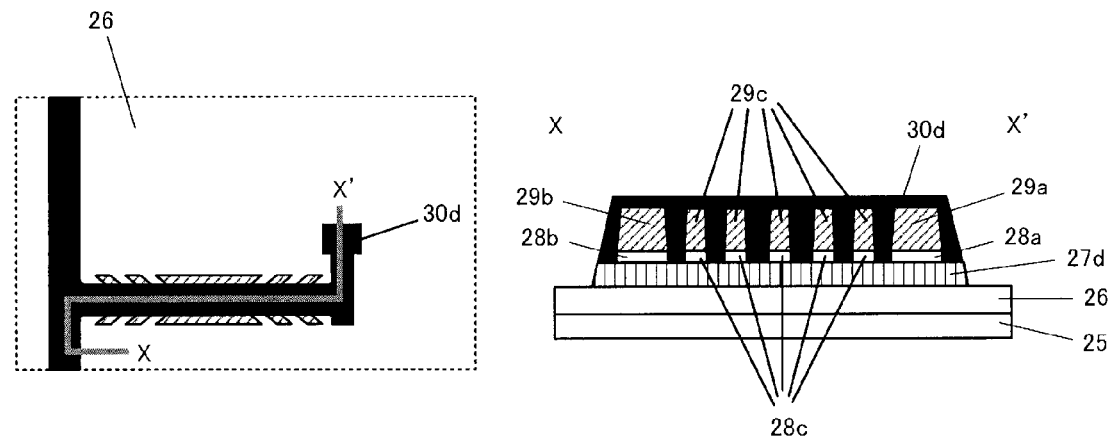

Step 5 (FIG. 5E)

Next, the silicon film 27 is removed in accordance with a publicly known dry etching technology in regions exposed from the photoresist pattern 30d, and thus, a semiconductor layer pattern 27d for a resistor element is formed. At this time, it also becomes possible to provide a final semiconductor layer pattern with a small channel width, that is to say, with a high resistance, by increasing making the etched film thicker in the photoresist pattern 30d and removing the silicon film 27 through etching (see FIG. 5F).

Figure 5G:
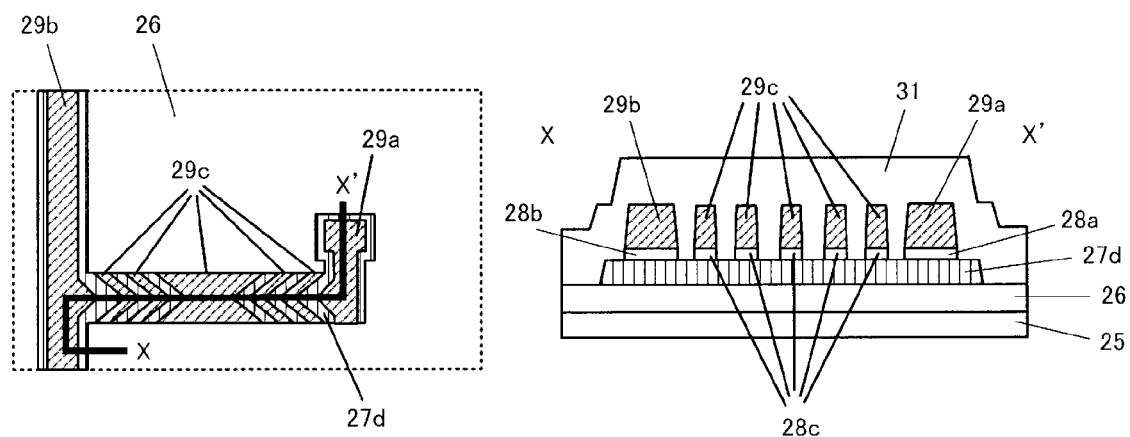

Step 6 (FIG. 5G)

Next, the photoresist pattern 30d is completely removed in accordance with a publicly known photoresist pattern removing technology. As a result, the semiconductor layer pattern 27b, the ohmic contact layer 28a, 28b and 28c, the electrode 29a, the electrode 29b and the dummy electrode 29c for a resistor element are formed in a single photolithography step, as in the first embodiment.

Step 7 (FIG. 5H)

Next, a passivation film 31 is formed in accordance with a publicly known film formation technology, so that the exposed insulating film 26, the semiconductor layer pattern 27d, the electrode 29a, the electrode 29b and the dummy electrode 29c are covered. The passivation film 31 is the same as the above described passivation film 20.

The basic structure for the resistor element for a liquid crystal display device is completed through the above steps. Contact holes may be created for the electrode 29a and the electrode 29b if necessary, so that the upper layer is partially exposed, and furthermore, a transparent conductive film pattern may be formed in the upper layer of the exposed portions, so that they can be connected to other circuit elements via the transparent conductive film pattern.

Third Embodiment

FIGS. 6A to 6H are diagrams showing other embodiments of the present invention, and correspond to FIG. 1A.

The electrodes and the dummy electrodes in FIGS. 6A to 6H are different from those in FIG. 1A in a plane. In FIGS. 6A to 6H, 33 is a semiconductor layer pattern, 32a and 32b are electrodes, and 32c is a dummy electrode pattern.

Figure 6A:
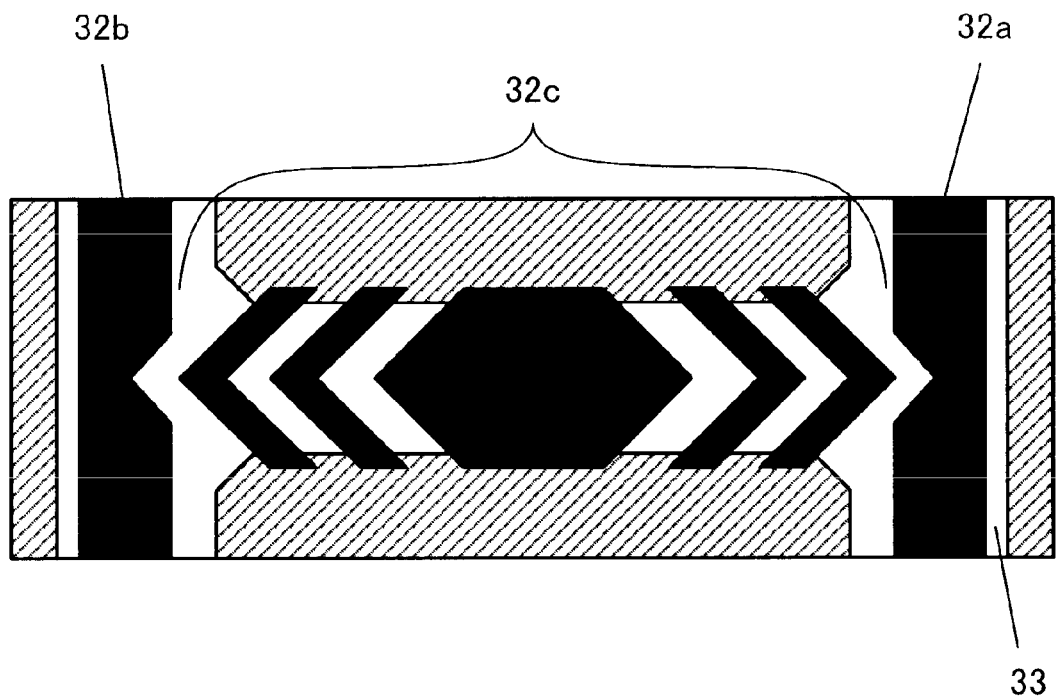
FIGS. 6A to 6H are plan diagrams showing display devices according to other embodiments of the present invention and correspond to FIG. 1A.

In FIG. 6A, the above described dummy electrode pattern 32c is formed so as to include dummy electrodes of which the two ends protrude in one direction in which electrodes are aligned from the center.

In this case, the above described dummy electrodes form the dummy electrode pattern 32c, where the intervals between adjacent electrodes (including the dummy electrodes) are kept approximately constant in the longitudinal direction of the dummy electrodes. In addition, the electrodes 32a and 32b have such a form as to have a constant interval with adjacent dummy electrodes. This is the same for the dummy electrode pattern 32c and the pattern for the electrodes 32a and 32b shown in FIG. 6B onward.

Figure 6B:
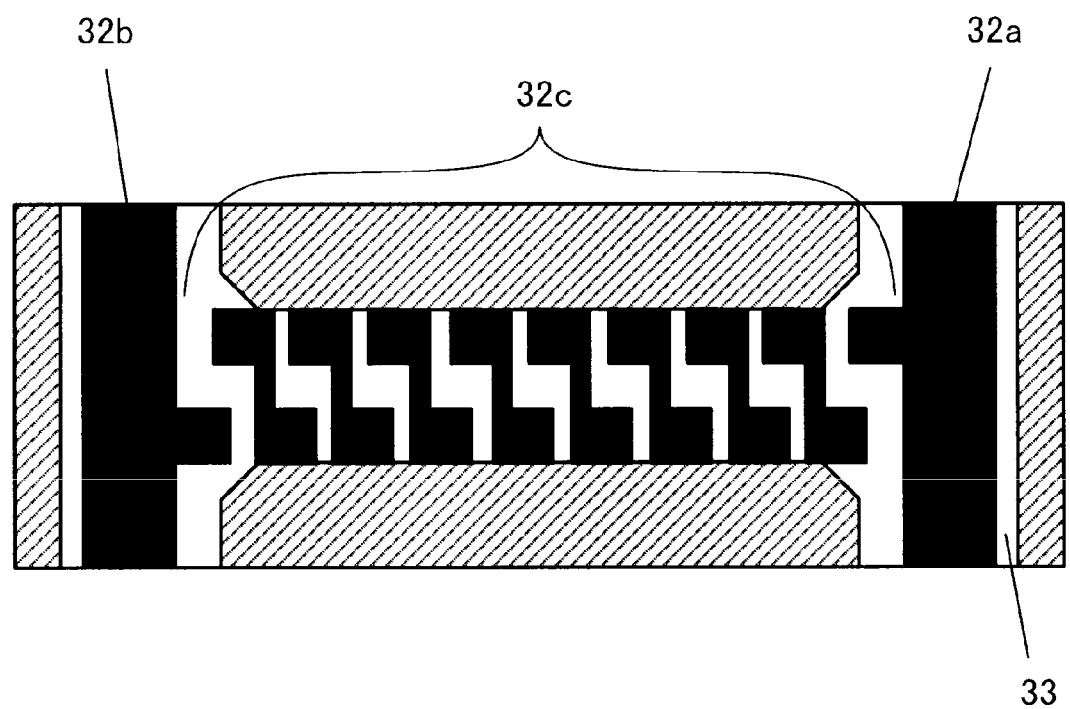

In FIG. 6B, the above described dummy electrode pattern 32c is formed so as to include dummy electrodes having one end protruding from the center in one direction in which electrodes are aligned and the other end protruding in the other direction in which electrodes are aligned.

Figure 6C:
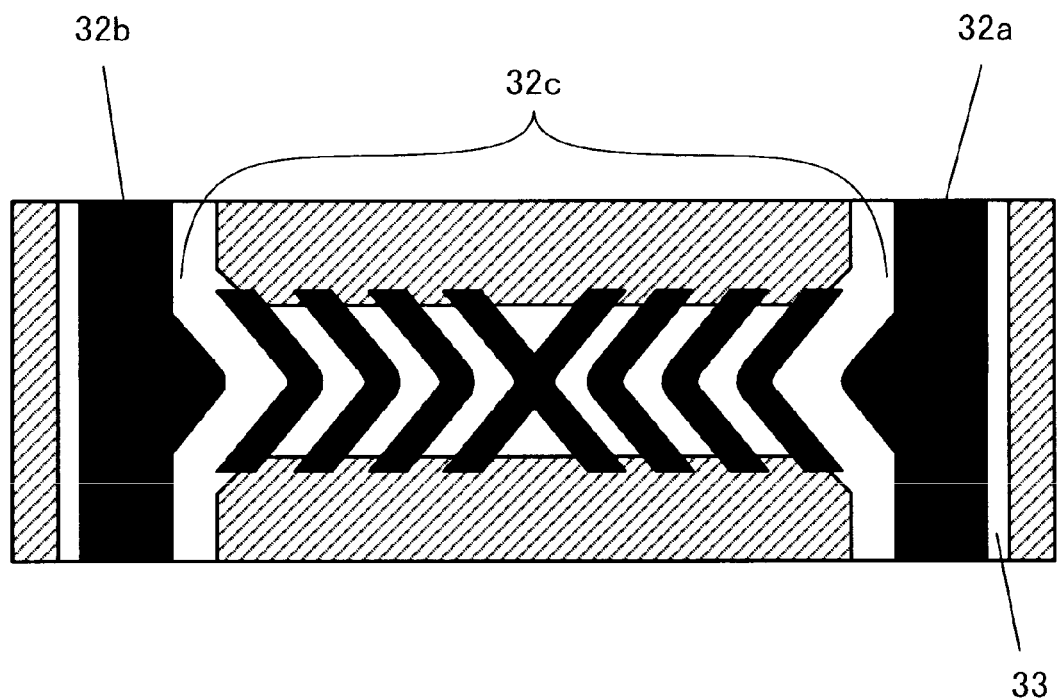

In FIG. 6C, the above described dummy electrode pattern 32c is formed so as to include dummy electrodes having the two ends protruding from the center in one direction in which electrodes are aligned.

Figure 6D:
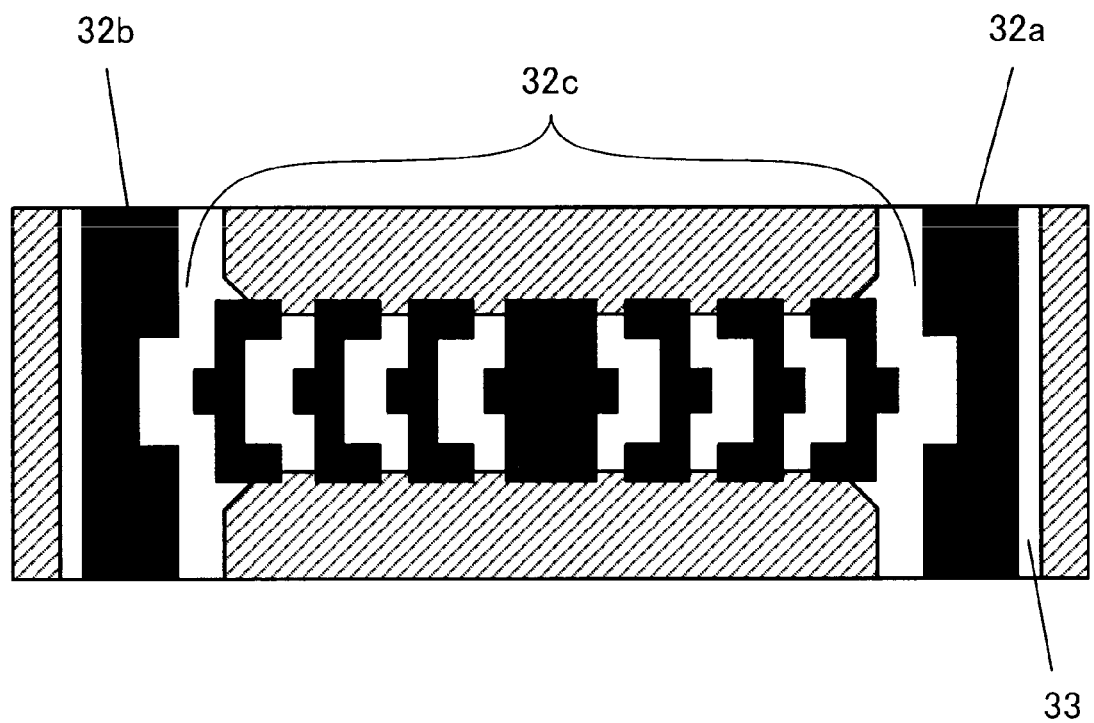

In FIG. 6D, the above described dummy electrode pattern 32c is formed so as to include dummy electrodes with the center protruding in one direction in which electrodes are aligned and the two ends protruding in the other direction in which electrodes are aligned.

Figure 6E:
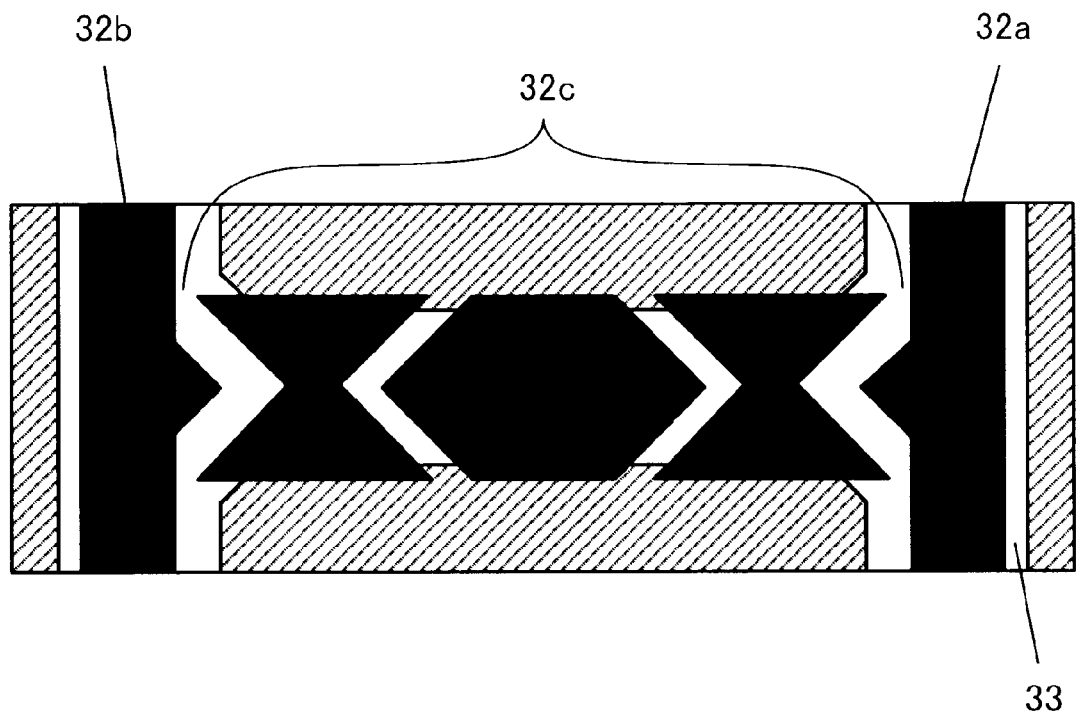

In FIG. 6E, the above described dummy electrode pattern 32c is formed so as to include dummy electrodes with the two ends protruding from the center in the two directions in which electrodes are aligned.

Figure 6F:
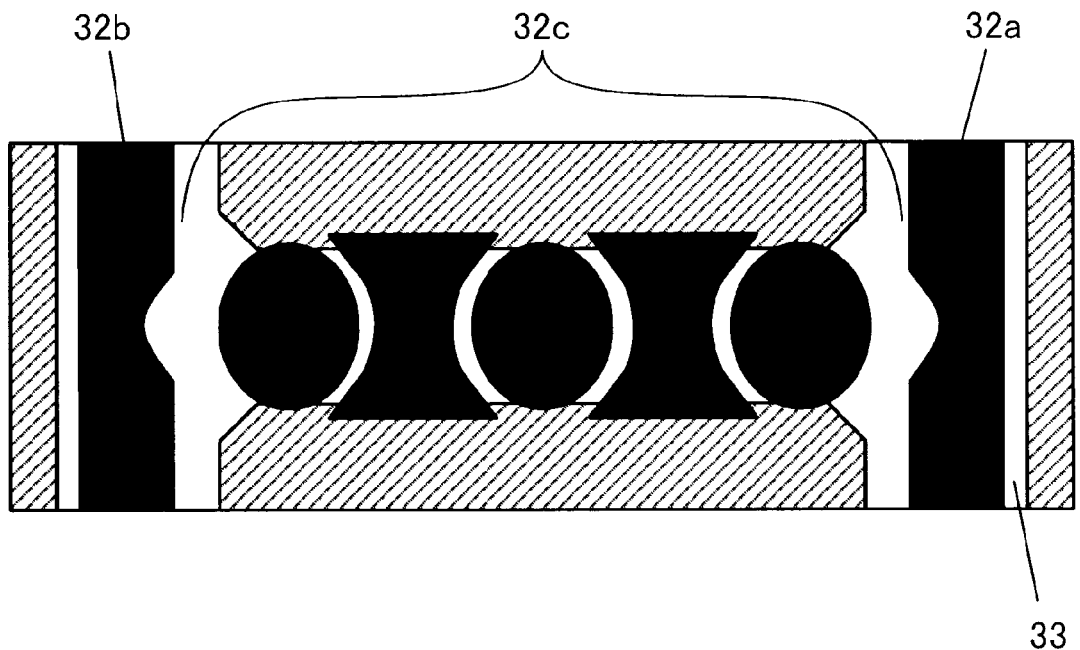

In FIG. 6F, the above described dummy electrode pattern 32c is formed so as to include some dummy electrodes which have the two ends protruding from the center in the two directions in which electrodes are aligned, and other dummy electrodes which are circular.

Figure 6G:
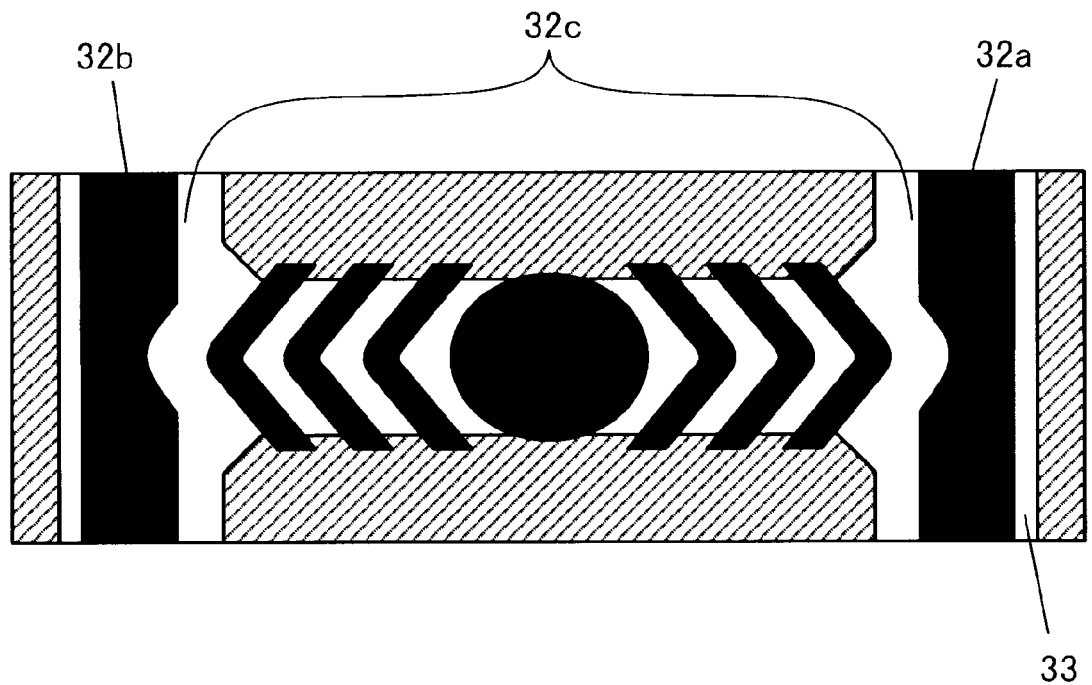

In FIG. 6G, the above described dummy electrode pattern 32c is formed so as to include some dummy electrodes which have the two ends protruding from the center in one direction in which electrodes are aligned, and other dummy electrodes which are circular.

Figure 6H:
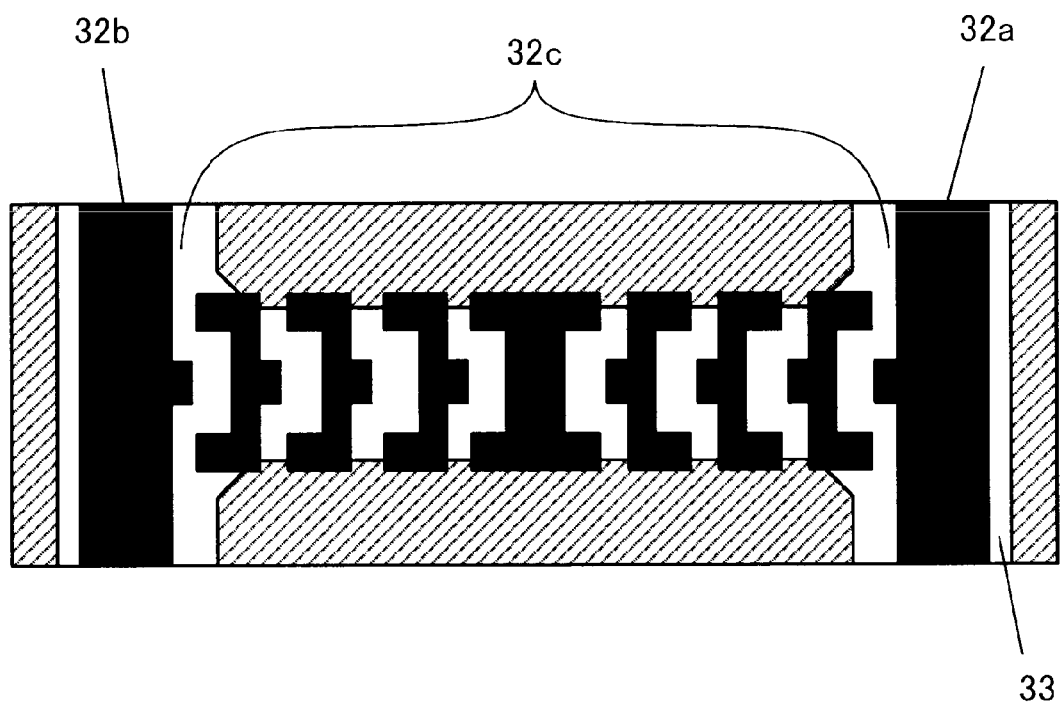

In FIG. 6H, the above described dummy electrode pattern 32c is formed so as to include dummy electrodes with the center protruding in one direction in which electrodes are aligned, and the two ends protruding in the other direction in which electrodes are aligned.

All of these dummy electrode patterns 32c are formed so as to include a number of electrodes (including dummy electrodes) which are aligned, where a protrusion is formed on at least one end side of at least one side of the facing sides in the direction in which the electrodes are aligned.

INDUSTRIAL APPLICABILITY

The above described elements according to the embodiments can be used on substrates having an electroluminescence display device or an integrated circuit, in addition to a liquid crystal display device.

What is claimed is:

1. A display device where elements are formed on an insulating substrate, characterized in that said elements comprise:

a semiconductor layer pattern formed on a main surface of said insulating substrate or on an insulating film layer formed on the main surface; and a number of electrodes provided in parallel at a distance from each other on said semiconductor layer pattern, said number of electrodes having facing sides and being a first electrode, a second electrode and dummy electrodes located between the first electrode and the second electrode, wherein said number of electrodes are patterned so that a protrusion is formed, in which said electrodes are aligned, on at least one end side of at least one of the facing sides.

2. The display device according to claim 1, characterized in that a dummy electrode has a pattern where two ends protrude from a center in one direction in which electrodes are aligned.

3. The display device according to claim 1, characterized in that a dummy electrode has a pattern where one end protrudes from a center in one direction in which electrodes are aligned and another end protrudes in an opposite direction in which electrodes are aligned.

4. The display device according to claim 1, characterized in that a dummy electrode has a pattern where a center protrudes in one direction in which electrodes are aligned and two ends protrude in the other direction in which electrodes are aligned.

5. The display device according to claim 1, characterized in that a dummy electrode has a pattern where one end protrudes from a center in one direction in which electrodes are aligned and another end protrudes in an opposite direction in which electrodes are aligned.

6. The display device according to claim 1, characterized in that said elements are thin film transistors where said first electrode is either the source electrode or the drain electrode and the second electrode is the other, and a gate electrode is provided beneath said insulating film.

7. The display device according to claim 1, characterized in that
   a display region is formed of a number of pixels on said insulating substrate and
   said elements are formed outside said display region as resistor elements.

8. The display device according to claim 1, characterized in that said insulating film is made of silicon nitride, silicon oxide or silicon nitride oxide, and said semiconductor layer pattern is made of amorphous silicon or crystalline silicon.

9. The display device according to claim 1, characterized in that
   each of said electrodes is formed of an impurity semiconductor layer and a metal layer layered on top of the semiconductor layer, and
   said impurity semiconductor layer is added is formed as an ohmic contact layer.

10. The display device according to claim 1, characterized in that said electrodes are formed so as to have one of the following structures:
   a one-layer structure of chromium, a chromium alloy, tungsten, a tungsten alloy, titanium, a titanium alloy, molybdenum, a molybdenum, an aluminum alloy or a copper alloy;
   a two-layer structure of an aluminum alloy and chromium or a chromium alloy;
   a two-layer structure of an aluminum alloy and tungsten or a tungsten alloy;
   a two-layer structure of an aluminum alloy and titanium or a titanium alloy;
   a two-layer structure of an aluminum alloy and molybdenum or a molybdenum alloy;
   a two-layer structure of a copper alloy and chromium or a chromium alloy;
   a two-layer structure of a copper alloy and tungsten or a tungsten alloy;
   a two-layer structure of a copper alloy and titanium or a titanium alloy;
   a two-layer structure of a copper alloy and molybdenum or a molybdenum alloy;
   a three-layer structure an aluminum alloy between two layers of chromium or a chromium alloy;
   a three-layer structure of an aluminum alloy between two layers of tungsten or a tungsten alloy;
   a three-layer structure of an aluminum alloy between two layers of molybdenum or a molybdenum alloy;
   a three-layer structure of a copper alloy between two layers of chromium or a chromium alloy;
   a three-layer structure of a copper alloy between two layers of tungsten or a tungsten alloy;
   a three-layer structure of a copper alloy between two layers of titanium or a titanium alloy;
   a three-layer structure of a copper alloy between two layers of molybdenum or a molybdenum alloy.

* * * * *